(12) United States Patent
Machler et al.

(10) Patent No.: US 10,475,724 B2
(45) Date of Patent: Nov. 12, 2019

(54) HEAT EXCHANGERS FOR DUAL-SIDED COOLING

(71) Applicant: DANA CANADA CORPORATION, Oakville (CA)

(72) Inventors: Meinrad K. A. Machler, Oakville (CA); Colin A. Shore, Hamilton (CA)

(73) Assignee: Dana Canada Corporation, Oakville, Ontario (CA)

( * ) Notice: Subject to any disclaimer, the term of this patent is extended or adjusted under 35 U.S.C. 154(b) by 0 days.

(21) Appl. No.: 15/755,688

(22) PCT Filed: Aug. 26, 2016

(86) PCT No.: PCT/CA2016/051010
§ 371 (c)(1),
(2) Date: Feb. 27, 2018

(87) PCT Pub. No.: WO2017/031596
PCT Pub. Date: Mar. 2, 2017

(65) Prior Publication Data
US 2018/0261526 A1 Sep. 13, 2018

Related U.S. Application Data

(60) Provisional application No. 62/210,542, filed on Aug. 27, 2015.

(51) Int. Cl.
*H01L 23/40* (2006.01)
*F28F 3/12* (2006.01)
(Continued)

(52) U.S. Cl.
CPC .......... *H01L 23/4012* (2013.01); *F28D 1/035* (2013.01); *F28F 3/12* (2013.01);
(Continued)

(58) Field of Classification Search
None
See application file for complete search history.

(56) References Cited

U.S. PATENT DOCUMENTS

| RE35,890 E | 9/1998 | So |
| 5,887,435 A | 3/1999 | Morton |

(Continued)

FOREIGN PATENT DOCUMENTS

| CN | 102209454 A | 10/2011 |
| CN | 202013133 U | 10/2011 |

(Continued)

OTHER PUBLICATIONS

Dana Kicks Copper to the Curb in Favor of All-aluminum Cooling Products for EVs, Charge Electric, Vehicle Magazine, Issue 19, May/Jun. 2015.

(Continued)

*Primary Examiner* — Long Pham
(74) *Attorney, Agent, or Firm* — Marshall & Melhorn, LLC

(57) ABSTRACT

A heat exchanger for cooling a plurality of heat-generating components with flat surfaces arranged in spaced parallel relation to one another has at least three flat, fluid-carrying panels, including a first end panel, a second end panel, and at least one middle panel. The middle panels have both of their opposed surfaces in thermal contact with a surface of a heat generating component. The end panels each have one surface in thermal contact with a surface of a heat-generating component. Inlet and outlet manifolds of the heat exchanger are in communication with the inlet and outlet openings of the middle panels. The inlet manifold communicates with the inlet opening of the first end panel, the outlet manifold communicates with the outlet opening of the second end panel, and the outlet opening of the first end (Continued)

panel communicates with the inlet opening of the second end panel.

18 Claims, 15 Drawing Sheets

(51) Int. Cl.
    *H05K 7/20*     (2006.01)
    *H01L 23/473*     (2006.01)
    *H01L 21/48*     (2006.01)
    *F28F 9/14*     (2006.01)
    *F28D 1/03*     (2006.01)
    *H01L 23/46*     (2006.01)

(52) U.S. Cl.
    CPC ............ *F28F 9/14* (2013.01); *H01L 21/4882* (2013.01); *H01L 23/46* (2013.01); *H01L 23/473* (2013.01); *H05K 7/20927* (2013.01); *F28F 2280/06* (2013.01); *H01L 2023/4031* (2013.01); *H01L 2023/4056* (2013.01); *H01L 2023/4087* (2013.01)

(56) References Cited

U.S. PATENT DOCUMENTS

| | | | |
|---|---|---|---|
| 6,273,183 B1 | 8/2001 | So et al. | |
| 6,639,798 B1 | 10/2003 | Jeter et al. | |
| 6,653,741 B2 | 11/2003 | Sreeram et al. | |
| 6,703,128 B2 | 3/2004 | Myers et al. | |
| 6,812,553 B2 | 11/2004 | Gerbsch et al. | |
| 7,187,083 B2 | 3/2007 | Lewis et al. | |
| 7,295,433 B2 | 11/2007 | Taylor et al. | |
| 7,663,242 B2 | 2/2010 | Lewis et al. | |
| 7,759,778 B2 | 7/2010 | Lowry et al. | |
| 8,094,453 B2 | 1/2012 | Campbell et al. | |
| 8,649,177 B2 | 2/2014 | Chainer et al. | |
| 8,726,976 B2 | 5/2014 | Schrader et al. | |
| 8,913,384 B2 | 12/2014 | David et al. | |
| 8,938,880 B2 | 1/2015 | Loong et al. | |
| 9,157,683 B2 | 10/2015 | Doe et al. | |
| 2011/0232882 A1 | 9/2011 | Zaffetti | |
| 2012/0037339 A1 | 2/2012 | Lipp et al. | |
| 2014/0224452 A1 | 8/2014 | Abels | |
| 2014/0301031 A1 | 10/2014 | Louvar et al. | |
| 2015/0109734 A1 | 4/2015 | Boday et al. | |
| 2015/0171578 A1 | 6/2015 | Taylor et al. | |
| 2016/0223264 A9 | 8/2016 | Desikan et al. | |

FOREIGN PATENT DOCUMENTS

| | | |
|---|---|---|
| CN | 103575140 A | 2/2014 |
| CN | 104101238 A | 10/2014 |
| JP | 2009141183 A | 6/2009 |
| WO | 2016008509 A1 | 1/2016 |

OTHER PUBLICATIONS

Chinese Office Action dated May 8, 2019 issued in Appln. No. 201680063188.1.

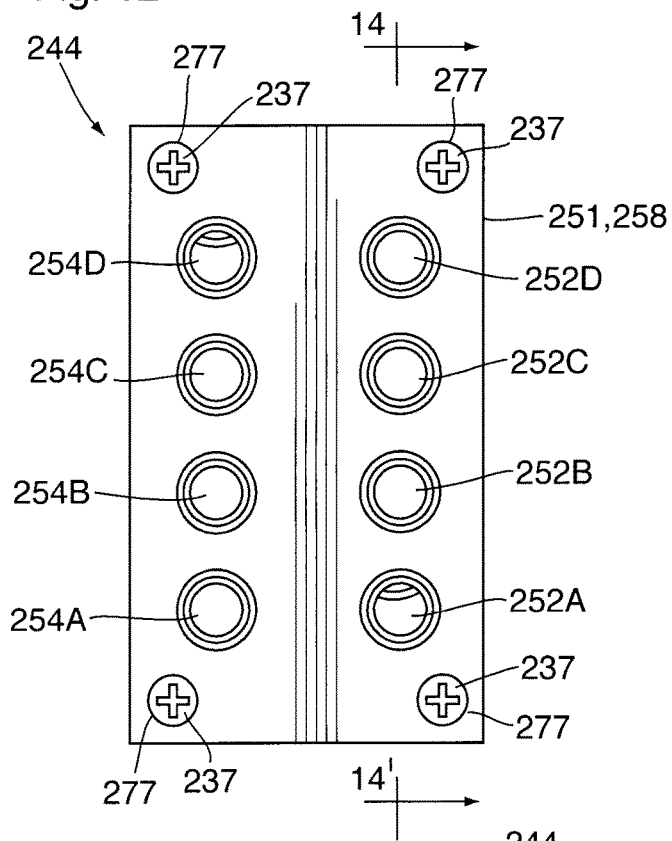
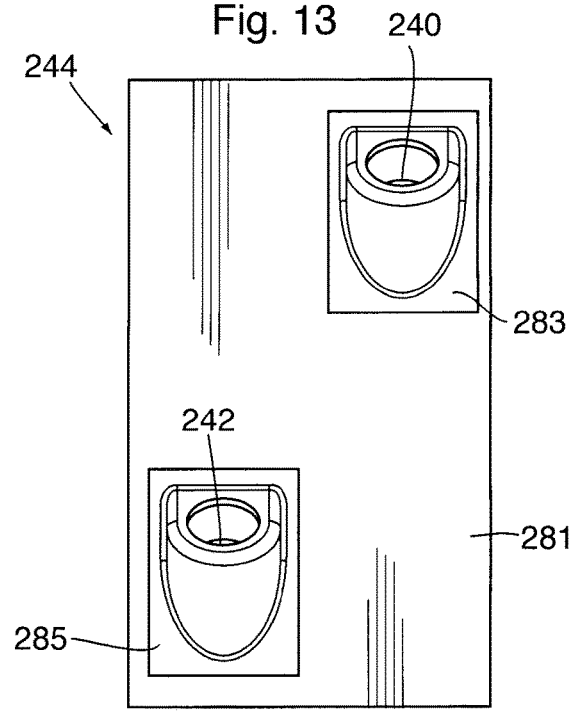

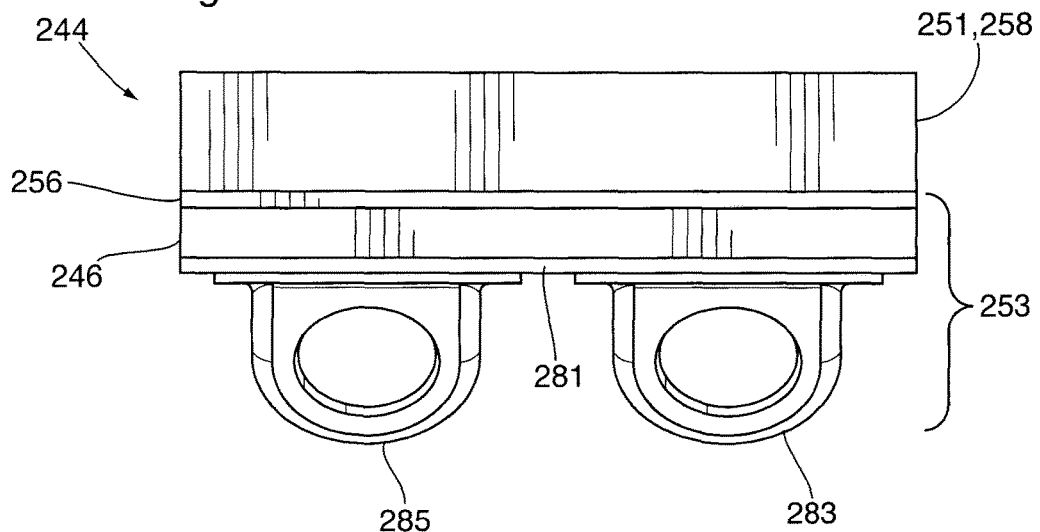
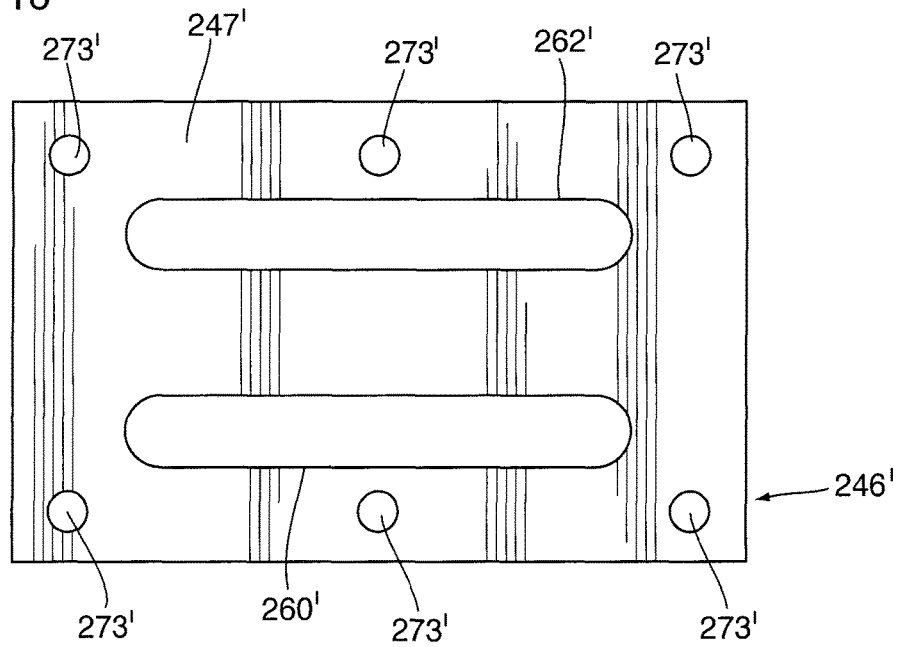

HEAT EXCHANGERS FOR DUAL-SIDED COOLING

CROSS-REFERENCE TO RELATED APPLICATION

This application claims priority to and the benefit of U.S. Provisional Patent Application No. 62/210,542 filed Aug. 27, 2015, the contents of which are incorporated herein by reference.

TECHNICAL FIELD

The invention generally relates to heat exchangers, and particularly to heat exchangers comprising a plurality of fluid-carrying panels for cooling heat-generating components.

BACKGROUND

Electric vehicles ("EV") and hybrid electric vehicles ("HEV") employ power electronics devices which generate significant amounts of heat energy. This heat energy must be dissipated to avoid excessive heating of these devices, which could lead to damage or reduced performance.

Automotive power electronics devices typically include one or more heat-generating electronic components such as transistors, resistors, capacitors, field effect transistors (FETS), isolated gate bipolar transistors (IBGTs), power inverters, DC to DC converters and DC to AC converters. These components may be mounted on a substrate such as a printed circuit board.

Although the structure of automotive power electronics devices is variable, the power electronic devices in some applications are provided with opposed planar faces along which cooling can be effected. IGBTs are an example of power electronic devices which may have this structure. Such devices can be cooled by contacting one or both of the opposed planar faces of the device with a heat sink. In order to maximize thermal contact with the planar face of the power electronic device, the heat sink has a planar surface along which it contacts the power electronic device, and a thin layer of thermal interface material (TIM) may be provided between the heat sink and the planar face of the power electronic device. To enhance heat transfer, a cooling fluid such as air or a liquid coolant may be circulated along the surface of the heat sink which is opposite to the surface in contact with the power electronics device.

An example of a cooling arrangement for power electronics devices is disclosed in U.S. Pat. No. 7,295,433 B2 to Taylor et al. In accordance with this patent, an electronics assembly is provided in which a plurality of electronics packages are mounted on a circuit board, with the opposed side surfaces of the electronics packages being in thermal contact with a first heat sink device and a second heat sink device, each of the heat sink devices having a fluid flow passage for circulation of a cooling fluid. The assembly disclosed by Taylor et al. is held together by clamps, with the electronics packages and circuit board being sandwiched between the heat sink devices. A similar arrangement for two-sided cooling of power electronics devices is disclosed in US Publication No. 2015/0171578 A1 to Taylor et al.

While the above-described structures are useful for cooling power electronics devices in which the components have a co-planar arrangement, they may not be useful for other arrangements, as when a plurality of components of a power electronics device are arranged in spaced, side-by-side relation to one another.

There remains a need for simple and effective structures for cooling of power electronic devices and other heat-generating components arranged in spaced, side-by-side relation to one another.

SUMMARY

In an embodiment, there is provided a heat exchanger for cooling a plurality of heat-generating components, each having a first surface and a second surface, wherein the first and second surfaces of each said heat-generating component are substantially flat and planar, and wherein the heat-generating components are arranged in spaced, parallel relation to one another, with spaces being provided between adjacent pairs of said heat-generating components; the heat exchanger comprising at least three flat, fluid-carrying panels, including a first end panel, a second end panel, and at least one middle panel, wherein each said fluid-carrying panel has a first surface, an opposed second surface, and an inlet opening, an outlet opening, and a fluid-flow passageway in flow communication with the inlet and outlet openings; wherein each of the at least one middle panels is adapted to be at least partially received in one of said spaces with its first surface in thermal contact with the first or second surface of one said heat-generating component, and with its second surface in thermal contact with the first or second surface of another said heat-generating component; and wherein each of the first end panel and the second end panel is adapted to be in thermal contact with the first or second surface of an endmost one of said heat-generating components.

In another embodiment, there is provided a heat exchanger assembly, comprising: (a) a plurality of heat-generating components, each having a first surface and a second surface, wherein the first and second surfaces are substantially flat and planar, and wherein the heat-generating components are arranged in spaced, parallel relation to one another, with spaces being provided between adjacent pairs of said heat-generating components; and (b) a heat exchanger as described herein; wherein each of the at least one middle panels is at least partially received in one of said spaces with its first surface in thermal contact with the first or second surface of one said heat-generating component, and with its second surface in thermal contact with the first or second surface of another said heat-generating component; and wherein each of the first end panel and the second end panel has its first or second surface in thermal contact with the first or second surface of an endmost one of said heat-generating components.

BRIEF DESCRIPTION OF THE DRAWINGS

The embodiments will now be described, by way of example only, with reference to the accompanying drawings in which:

FIG. 12 is a top plan view of the manifold structure of FIG. 11;

FIG. 13 is a bottom plan view of the manifold structure of FIG. 11;

FIG. 15 is an end view of the manifold structure of FIG. 11; and

FIG. 16 shows a plan view of a bottom plate of an alternate manifold structure.

DETAILED DESCRIPTION

Figure 1:
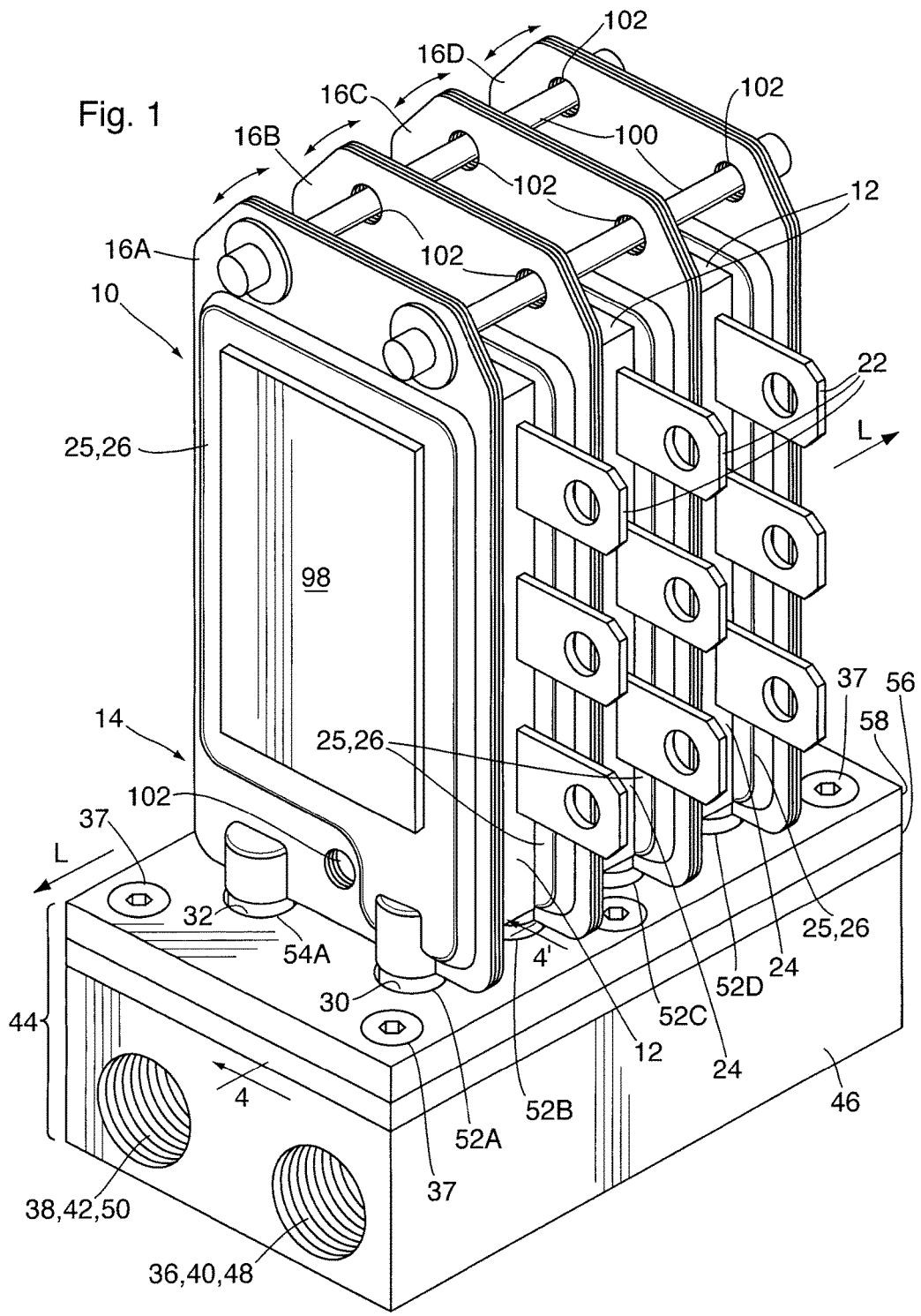
FIG. 1 is a perspective view of a heat exchanger assembly according to a first embodiment described herein.

The following is a description of a power electronics assembly 10 for an electric or hybrid electric vehicle. The power electronics assembly 10 comprises a plurality of electronic components 12 and a heat exchanger 14 comprising a plurality of fluid-carrying panels 16. Although the following description specifically relates to cooling of power electronics components, it will be appreciated that the heat exchangers disclosed herein can be adapted for use in other heat exchanger assemblies for cooling of other heat-generating components, particularly those having a similar configuration and arrangement as the power electronics components discussed herein.

The plurality of electronic components 12 illustrated herein comprises a plurality of double-sided power modules, each of which may comprise an IGBT module. In the following description it is assumed that the electronic components are IGBT modules, and therefore the terms "electronic component" and "IGBT module" are used interchangeably, and are both identified by reference numeral 12. Although the electronic components 12 in the present embodiment comprise IGBT modules, it will be appreciated that the identity of the electronic component 12 may vary without departing from the scope of the present disclosure.

The power electronics assembly 10 according to the present embodiment includes a total of three electronic components 12, each having a first external surface 18 and an opposed second external surface 20. Although three electronic components 12 are shown in the drawings, it will be appreciated that the plurality of electronic components 12 in assembly 10 comprises at least two electronic components 12.

Figure 2:
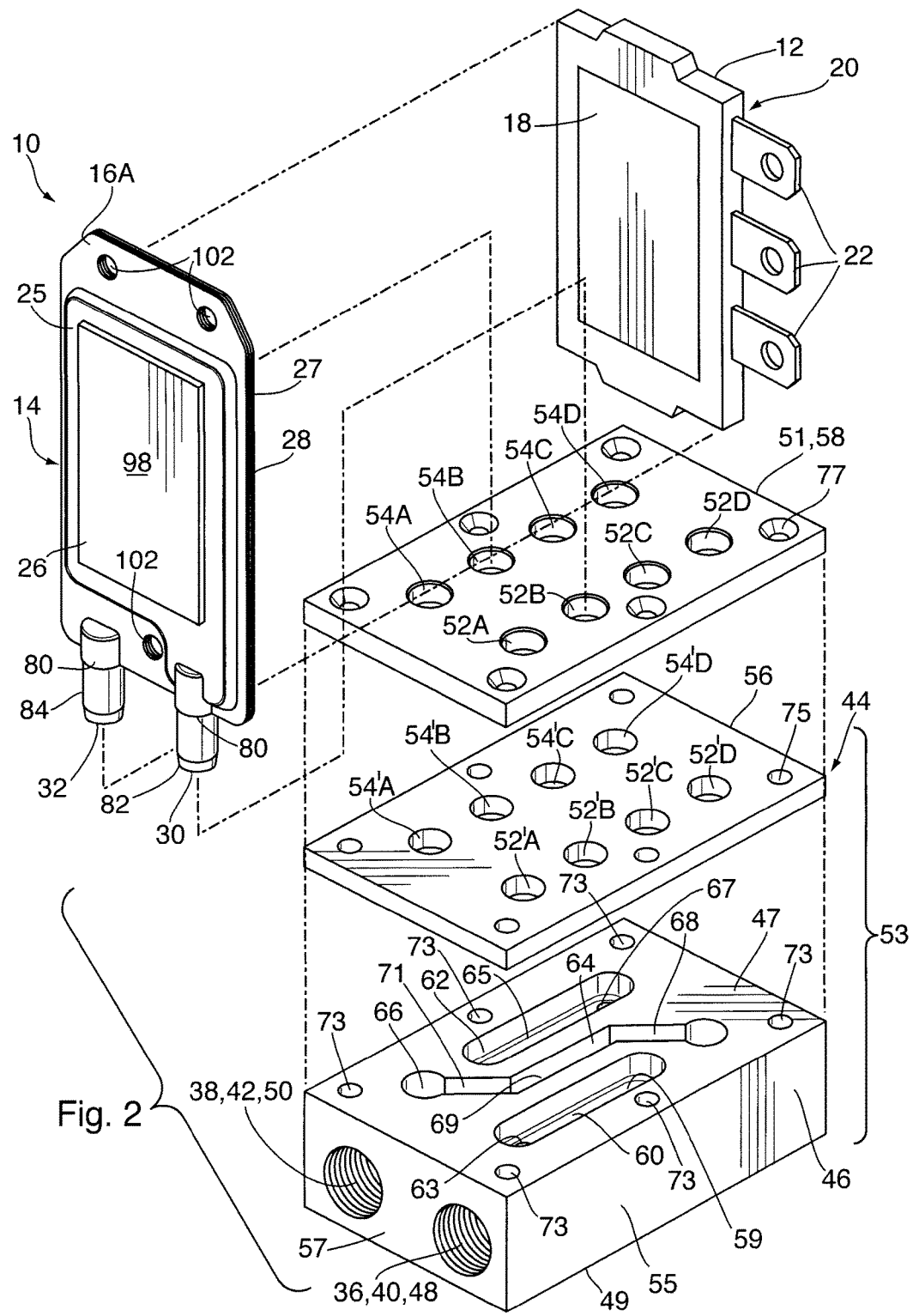
FIG. 2 is an exploded perspective view of the heat exchanger assembly of FIG. 1.

As can be seen from FIG. 2, each electronic component 12 is in the shape of a substantially flat rectangular prism, with the first and second surfaces 18, 20 comprising the two major surfaces of the prism, and accounting for most of the surface area thereof. The electronic component 12 comprises electric circuitry which is encased over most of its area by a dielectric material, such as a polymer, with the electric circuitry including exposed leads or connectors 22 protruding from one of the sides of the component 12. The electric circuitry of each electronic component generates heat, which in turn heats the dielectric material of the electronic component 12. As mentioned above, the electronic components 12 are "two-sided", meaning that both the first and second surfaces 18, 20 become heated by the electric circuitry and both surfaces 18, 20 require cooling. Depending on the location of the electrical circuitry in relation to the first and second surfaces 18, 20, however, the first and second surfaces 18, 20 may require different degrees of cooling, as will be further discussed below.

The first and second surfaces 18, 20 of each electronic component 12 are substantially flat and planar, and are substantially parallel to one another. Furthermore, the electronic components 12 are arranged in spaced, parallel relation to one another, meaning that the first and second surfaces 18, 20 of the plurality of electronic components 12 are all parallel to one another. The electronic components 12 are spaced apart along a longitudinal axis L, wherein the first and second surfaces 18, 20 of the electronic components 12 are substantially perpendicular to longitudinal axis L.

It can also be seen from FIG. 1 that spaces 24 are provided between adjacent pairs of the electronic components 12. In the illustrated embodiment, which includes three electronic components 12, there are two spaces 24.

In the present embodiment the heat exchanger 14 comprises a total of four flat, fluid-carrying panels 16, also referred to herein as "cooling plates". However, it will be appreciated that the number of fluid-carrying panels 16 in heat exchanger 14 will depend on the number of electronic components 12, and that heat exchanger 14 therefore comprises at least three fluid-carrying panels 16.

The fluid-carrying panels 16 are arranged to provide cooling along both the first and second surfaces 18, 20 of each electronic component 12. Therefore, the heat exchanger 14 includes two fluid-carrying panels 16 which are located at opposite ends of heat exchanger 14 and which provide cooling to only one of the surfaces 18, 20 of one of the electronic components 12. These fluid-carrying panels 16 located at the opposite ends of heat exchanger 14 are referred to herein as the first end panel 16A and the second end panel 16D.

Each of the remaining fluid-carrying panels 16 of heat exchanger 14 are at least partially received in one of the spaces 24 between an adjacent pair of electronic components 12. These fluid-carrying panels 16 located in spaces 24 are referred to herein as "middle panels", and are identified by reference characters 16B and 16C. While the present embodiment includes two middle panels 16B, 16C, it will be appreciated that the heat exchanger 14 will include at least one middle panel 16, depending on the number of electronic components 12, and may include more than two middle panels 16.

In the present embodiment, all the fluid-carrying panels 16 are of identical construction, each having a flat, generally rectangular shape and having a first sidewall 25 defining a first external surface 26 and second sidewall 27 defining an opposed second external surface 28, wherein the first and second surfaces 26, 28 account for most of the surface area of the fluid-carrying panel 16.

The first and second surfaces 26, 28 of the fluid-carrying panels 16 are substantially flat and are in thermal contact with the first and second surfaces 18, 20 of the electronic components 12, so as to promote effective transfer of heat from each electronic component 12 to the fluid-carrying panels 16. Each of the middle panels 16B, 16C has its first surface 26 in thermal contact with the first or second surface 18, 20 of one of the electronic components 12, and its second surface 28 in thermal contact with the first or second surface 18, 20 of another, adjacent electronic component 12. Each of the end panels 16A, 16D has one of its first or second surface 26, 28 in thermal contact with the first or second surface 18, 20 of one of the electronic components 12.

As will be further described below, each of the fluid-carrying panels 16 further comprises an inlet opening 30, an outlet opening 32, and a fluid flow passageway 34 in flow communication with the inlet and outlet openings 30, 32. During operation, a liquid or gaseous coolant is circulated through the fluid-carrying panels 16 comprising heat exchanger 14. In the present embodiment, the heat exchanger 14 is adapted for use with a liquid coolant such as a mixture of water and glycol, which may be the same coolant circulating throughout the vehicle's cooling system (not shown).

The fluid-carrying heat exchanger panels 16 are provided with inlet and outlet fittings 82, 84 which define the respective inlet and outlet openings 30, 32. In the present embodiment, the fittings 82, 84 are in the form of straight, cylindrical tubes as further described below.

The heat exchanger 14 further comprises an inlet manifold 36 and an outlet manifold 38. The inlet manifold 36 receives coolant from the vehicle's cooling system through an inlet port 40 and supplies the coolant to the fluid-carrying panels 16. The outlet manifold 38 receives the coolant from the fluid-carrying panels 16, after it has absorbed heat from the electronic components 12, and returns the coolant back to the cooling system through an outlet port 42. The cooling system of the vehicle may include a heat exchanger such as a radiator (not shown) to remove the absorbed heat from the coolant.

In the present embodiment, the inlet and outlet manifolds 36, 38 are both housed in a manifold structure 44, the structure of which is further described below. However, it will be appreciated that the structure of the manifolds 36, 38 can be varied from the illustrated structure without departing from the invention. For example, the inlet and outlet manifolds 36, 38 may be separate from one another and can be in the form of tubes or other conduits linking together the inlet openings 30 and the outlet openings 32 of the fluid-carrying panels 16.

In the present embodiment, the inlet manifold 36 is in flow communication with the inlet opening 30 of each of the middle panels 16B, 16C, and therefore each of the middle panels 16B, 16C receives relatively cool coolant directly from the inlet manifold 36. The outlet manifold 38 is in flow communication with the outlet opening 32 of each of the middle panels 16B, 16C, and therefore the middle panels 16B, 16C discharge their heated coolant directly into the outlet manifold.

Figure 3:
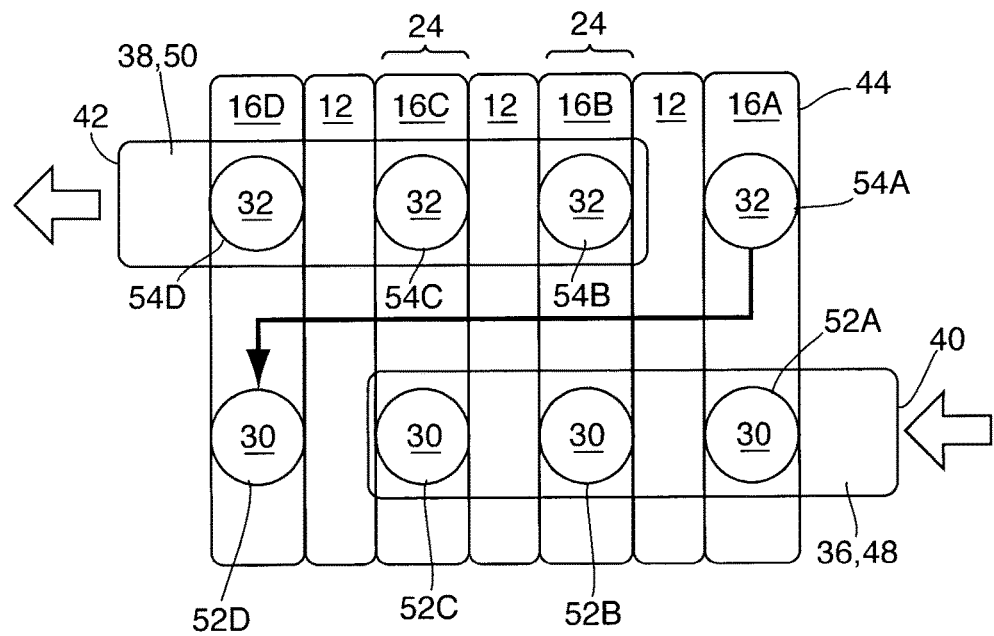
FIG. 3 is a schematic plan view showing the coolant flow paths through the manifold of the heat exchanger assembly of FIG. 1.

However, the manifold connections for the end panels 16A, 16D are somewhat different from those of the middle panels 16B, 16C, because they remove heat from only one surface 18 or 20 of one of the electronic components 12. In this regard, the inlet manifold 36 is in flow communication with the inlet opening 30 of the first end panel 16A, but does not directly supply coolant to the second end panel 16D. Instead, the outlet opening 32 of the first end panel 16A is in flow communication with the inlet opening 30 of the second end panel 16D, such that the second end panel 16D receives coolant which has been discharged by the first end panel 16A. Therefore, because less heat is absorbed by the end panels 16A, 16D, they are effectively combined by routing the coolant directly from the first end panel 16A to the second end panel 16D. The routing of the coolant through the inlet and outlet manifolds 36, 38 is schematically illustrated in FIG. 3.

The manifold structure 44 in the present embodiment is in the shape of a rectangular prism, although this is not essential. Generally speaking, the manifold structure 44 includes two portions, referred to herein as the first portion 51 (or top portion 51) and the second portion 53 (or bottom portion 53). The top portion 51 includes a plurality of apertures 52, 54 to receive the inlet and outlet fittings of the fluid-carrying panels 16, and may comprise one or more plates. The bottom portion 53 includes the inlet and outlet manifolds 36, 38; holes or connecting passages to provide communication between the manifolds and the apertures 52, 54 in the top portion; the inlet and outlet ports 40, 42; and may also comprise one or more plates. The top and bottom portions 51, 53 are sealingly joined together to form the manifold structure 44.

In the first embodiment, the top portion 51 comprises a top plate 58, and the bottom portion 53 comprises a middle plate 56 and a bottom plate 46. The top and middle plates 58, 56 may be of similar thickness, as shown in FIG. 2. The bottom layer 46 is sometimes referred to herein as a "block" rather than a "plate" because it has greater thickness than plates 58, 56 for reasons which will become apparent from the description below. The three layers 46, 56, 58 making up manifold structure 44 are sealingly secured together by screws 37.

Figure 2A:
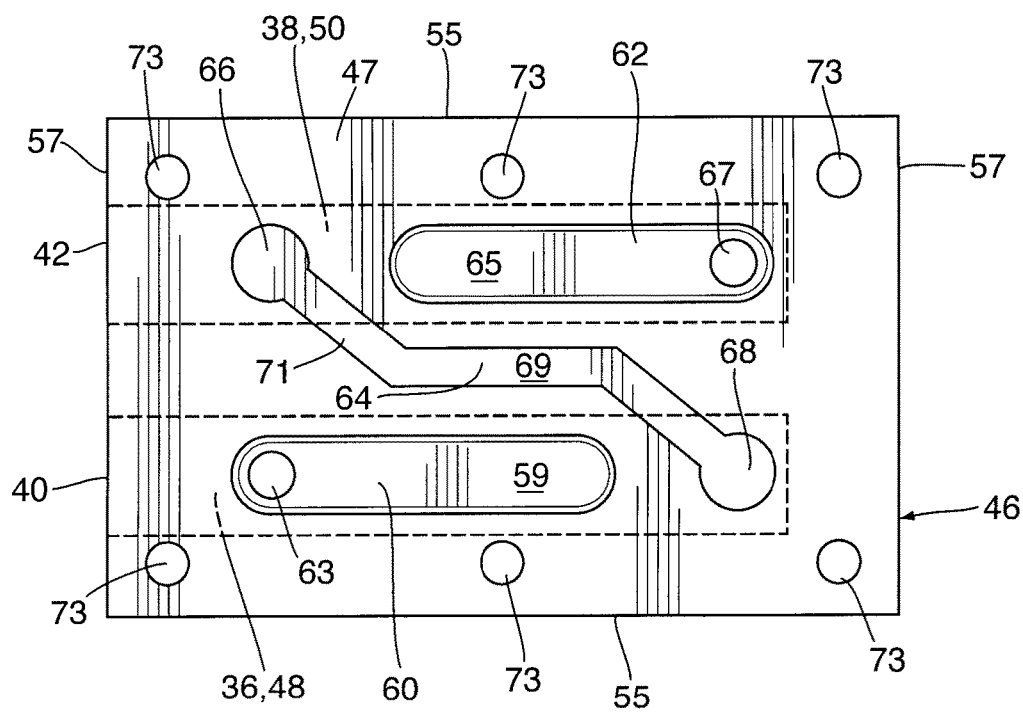
FIG. 2A is a plan view of the bottom block shown in FIG. 2.

The bottom block 46, best seen in FIGS. 2 and 2A, has a top face 47, an opposite bottom face 49, two side faces 55 parallel to axis L, and two end faces 57 transverse to axis L. In the present embodiment, the inlet and outlet ports 40, 42 for connection to the vehicle's coolant circulation system are both provided on one of the end faces 57. Therefore, the thickness of the bottom block 46 must be sufficient to accommodate the diameters of ports 40, 42 and any inlet and outlet fittings (not shown) which may be required for connecting the manifold structure 44 to fluid conduits of the vehicle's cooling system. Therefore, the bottom block 46 is shown in the drawings as having a thickness which is greater than that of the other layers 56, 58 making up the manifold structure 44. This greater thickness of the bottom block 46 will be required in any configuration where the inlet port 40 and the outlet port 42 are each provided on one of the side faces 55 or one of the end faces 57. In the present embodiment, the ports 40, 42 are shown as simple threaded holes, but it will be appreciated that ports 40, 42 may be provided with conventional fittings to permit connection to the cooling system.

In the present embodiment, the bottom face 47 and both side faces 55 of bottom block 46 are free of openings. Similarly, the end face 57 opposite to that which is provided with ports 40, 42 is free of openings.

The bottom block 46 also houses an inlet passage 48 which extends longitudinally from the inlet port 40 toward the opposite end face 57, and an outlet passage 50 which similarly extends longitudinally from the outlet port 42 toward the opposite end face 57. The inlet and outlet passages 48, 50 are also shown in FIG. 2A and in schematic FIG. 3.

The top face 47 of bottom block 46 is also provided with a pair of longitudinal slots extending along opposite sides of the top face 47. These slots are referred to herein as first longitudinal slot 60 (or "inlet slot" 60) and second longitudinal slot 62 (or "outlet slot" 62). The inlet slot 60 has an open top and a bottom surface 59 with an aperture 63 providing direct fluid flow communication with the interior of the inlet passage 48 and inlet manifold 36. Similarly, outlet slot 62 has an open top and a bottom surface 65 with an aperture 67 providing direct fluid flow communication with the interior of the outlet passage 50 and outlet manifold 38. The apertures 63 and 67 are best seen in FIG. 2A.

The top face 47 of bottom block 46 is further provided with a third slot 64 (also referred to herein as "crossover slot 64"). The third slot 64 extends generally diagonally across the top face 47, having a central portion 69 located between slots 60, 62, and having first and second end portions 66, 68 which are aligned longitudinally with the inlet and outlet slots 60, 62, respectively. The crossover slot 64 has an open top and includes a bottom surface 71 which is free of any openings, as best seen in FIG. 2A.

Finally, the top face 47 of bottom block 46 is provided with a plurality of blind, threaded holes 73 to receive threaded fasteners such as screws 37.

As mentioned above, the bottom portion 53 of manifold structure 44 includes a middle plate 56. The middle plate 56 is thinner than bottom block 46 and has a number of functions. Firstly, the middle plate has a plurality of pairs of openings 52', 54' which are positioned to provide fluid flow communication with the inlet and outlet openings 30, 32 of the fluid-carrying panels 16. Therefore, the openings 52', 54' of each pair are spaced apart transversely, while adjacent pairs of openings 52', 54' are spaced apart longitudinally. These inlet and outlet openings 52', 54' of middle plate 56 can be seen in FIG. 2, and comprise circular openings. One inlet opening 52' and one outlet opening 54' in middle plate 56 are provided for each inlet opening 30 and each outlet opening 32 of each of the fluid-carrying panels 16. To avoid confusion, each inlet opening 52' and outlet opening 54' is assigned a character "A", "B", "C", or "D" in the following discussion, depending on which of the fluid-carrying panels 16A, 16B, 16C or 16D it is connected to.

As can be seen in FIG. 2 and the schematic view of FIG. 3, the inlet openings 52'A, 52'B and 52'C of middle plate 56 are aligned with and in direct flow communication with the inlet slot 60, and therefore the inlet passage 48 and inlet manifold 36 are in flow communication with inlet openings 52'A, 52'B and 52'C of middle plate 56 through the inlet slot 60. The fourth inlet opening 52'D of middle plate 56, on the other hand, is in direct flow communication with the second end portion 68 of the crossover slot 64, the end portion 68 having a rounded end which aligns with inlet opening 52'D of the middle plate 56.

Similarly, outlet openings 54'B, 54'C and 54'D of middle plate 56 are aligned with and in direct flow communication with the outlet slot 62, and therefore the outlet passage 50 and the outlet manifold 38 are in flow communication with outlet openings 54'B, 54'C and 54'D of middle plate 56 through the outlet slot 62. The first outlet opening 54'A of middle plate 56, on the other hand, is in direct flow communication with the first end portion 66 of the crossover slot 64, the end portion 66 having a rounded end which aligns with outlet opening 54'A of the middle plate 56.

In addition, when the middle plate 56 and bottom block 46 are sealed together, the middle plate 56 covers and seals the open top of the crossover slot 64, except for the rounded ends of end portions 66, 68 which are in alignment with openings 54'A and 52'D, respectively. Therefore, the crossover slot 64 provides direct fluid flow communication between the first outlet opening 54'A and the fourth inlet opening 52'D. Thus, it can be seen that the crossover slot 64 provides the required fluid routing from the outlet opening 32 of the first end panel 16A to the inlet opening 30 of the second end panel 16D.

The middle plate 56 also has a seal retention function, which will be described below in connection with the description of top plate 58. Finally, the middle plate 56 is provided with a plurality of unthreaded through holes 75 to receive the threaded fasteners 37, the holes 75 of middle plate 56 being in alignment with threaded holes 73 of bottom block 46.

As mentioned above, top portion 51 of manifold structure 44 comprises top plate 58 which is thinner than bottom block 46 and functions primarily to receive the ends of inlet and outlet fittings 82, 84 of the fluid-carrying panels 16, and to provide fluid flow communication between the inlet and outlet openings 30, 32 of the fluid-carrying panels 16 and the bottom portion 53 of manifold structure 44. Therefore, the top plate 58 has a plurality of pairs of inlet and outlet openings 52A-D and 54A-D, which are positioned to align with and to provide direct fluid flow communication with the respective inlet and outlet openings 52'A-D and 54'A-D of the middle plate 56. Therefore, the spacing and locations of openings 52, 54 in top plate 58 correspond to those of the middle plate 56, described above. The top plate 58 is provided with a plurality of unthreaded through holes 77 to receive the threaded fasteners 37, with the holes 77 of top plate 58 being in alignment with holes 75 of middle plate 56 and threaded holes 73 of bottom block 46.

Although the inlet and outlet ports 40, 42 of the respective manifolds 36, 38 are located at the same end of manifold structure 44 in the present embodiment, this is not essential. For example, as shown in FIG. 3, the inlet and outlet ports 40, 42 may be located at opposite ends of the manifold structure 44, i.e. the inlet and outlet ports 40, 42 may be located in opposite end faces 57 of the manifold structure 44. Alternatively, one or both of the inlet and outlet ports 40, 42 could be located in one of the side faces 55 of manifold structure 44, and/or one or both of the inlet and outlet ports 40, 42 could be located in the bottom face 49 of the manifold structure 44.

The inlet and outlet fittings 82, 84 of fluid-carrying panels 16 are adapted to fit closely into the respective inlet and outlet openings 52, 54 of the top plate 58. Furthermore, the fittings 82, 84 form sealed connections with openings 52, 54 of top plate 58 through the use of resilient seals, which permit some movement of the top ends of the fluid-carrying panels 16, particularly along their upper edges (i.e. the edges remote from the manifold structure 44), which is advantageous during manufacture of the assembly 10 for reasons which will be discussed below.

The resilient sealing of the inlet fitting 82 of the fluid-carrying heat exchanger panel 16A inside inlet opening 52A of top plate 58 is now explained with reference to FIG. 4, it being appreciated that the sealing of inlet fittings 84 into the other inlet and outlet openings 52, 54 is accomplished in the same manner.

Figure 4:
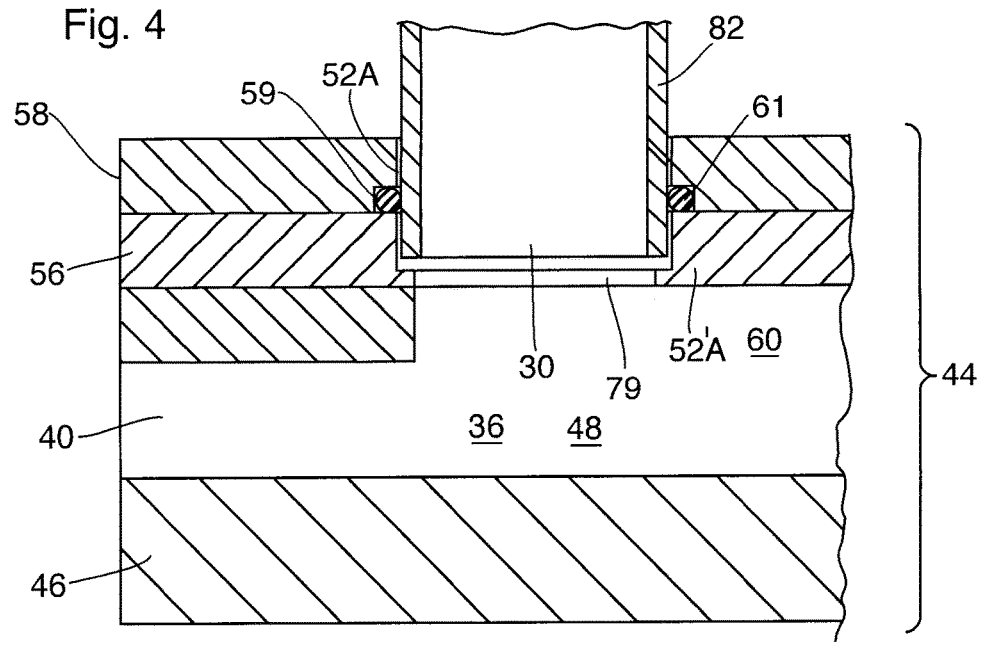
FIG. 4 is an enlarged, partial cross section through the manifold of FIG. 1 along line 4-4'.

As shown in FIG. 4, the top plate 58 of manifold structure 44 includes an annular recess 59 in its lower surface, surrounding the inlet opening 52A. This annular recess 59 has a rectangular or square cross-section in the present embodiment and is sized and shaped to receive a resilient O-ring 61. When the manifold structure 44 is assembled with the top plate 58 secured to the middle plate 56 by screws 37 (FIG. 1), the annular recess 59 and the top surface of the middle plate 56 combine to form an annular groove in which the O-ring 61 is compressed such that it projects radially inwardly from the walls of inlet opening 52A. Thus, when the tubular inlet fitting 82 is inserted into the inlet opening 52A, the O-ring 61 contacts the outer surface of the fitting 82, such that a resilient seal is formed between fitting 82 and inlet opening 52A by the O-ring 61. This same discussion applies to the sealing of all the inlet and outlet fittings 82, 84 inside the openings 52, 54 of the top plate 58.

As shown in FIG. 4, the inlet and outlet openings 52', 54' of the middle plate 56 may have stepped bores, with a first upper portion of the bore having a first diameter substantially the same as that of the inlet and outlet openings 52, 54 of the top plate 58, and a second lower portion of the bore having a smaller second diameter to provide a radially-inwardly extending lip 79 proximate to the lower surface of the middle plate 56. The second diameter of the bore is smaller than an outside diameter of the fittings 82, 84, so that the lip 79 forms a stop to prevent over-insertion of the fittings 82, 84 through the holes 52', 54' of the middle plate 56. Alternatively, the holes 52', 54' of the middle plate 56 may be of a single diameter which corresponds to the second diameter, such that the "stop" will be located at the bottom surface of the top plate 58.

As mentioned above, the first and second surfaces 18, 20 of the electronic components 12 may have different cooling requirements, depending on their specific construction. For the purpose of the following discussion, it will be assumed that the first surface 18 of each electronic component 12 requires greater cooling than the second surface 20. This may be due, for example, to the internal circuitry of electronic component 12 being located closer to the first surface 18 than to the second surface 20.

In order to effectively cool electronic components 12 having differential cooling requirements along their opposed surfaces 18, 20, the fluid flow passageways 34 of the fluid-carrying panels 16 are configured to provide greater cooling capacity along the first surface 26 than along the second surface 28. This differential cooling capacity is provided in at least the middle panels 16B, 16C, and is optionally provided also in the end panels 16A, 16D.

Figure 5:
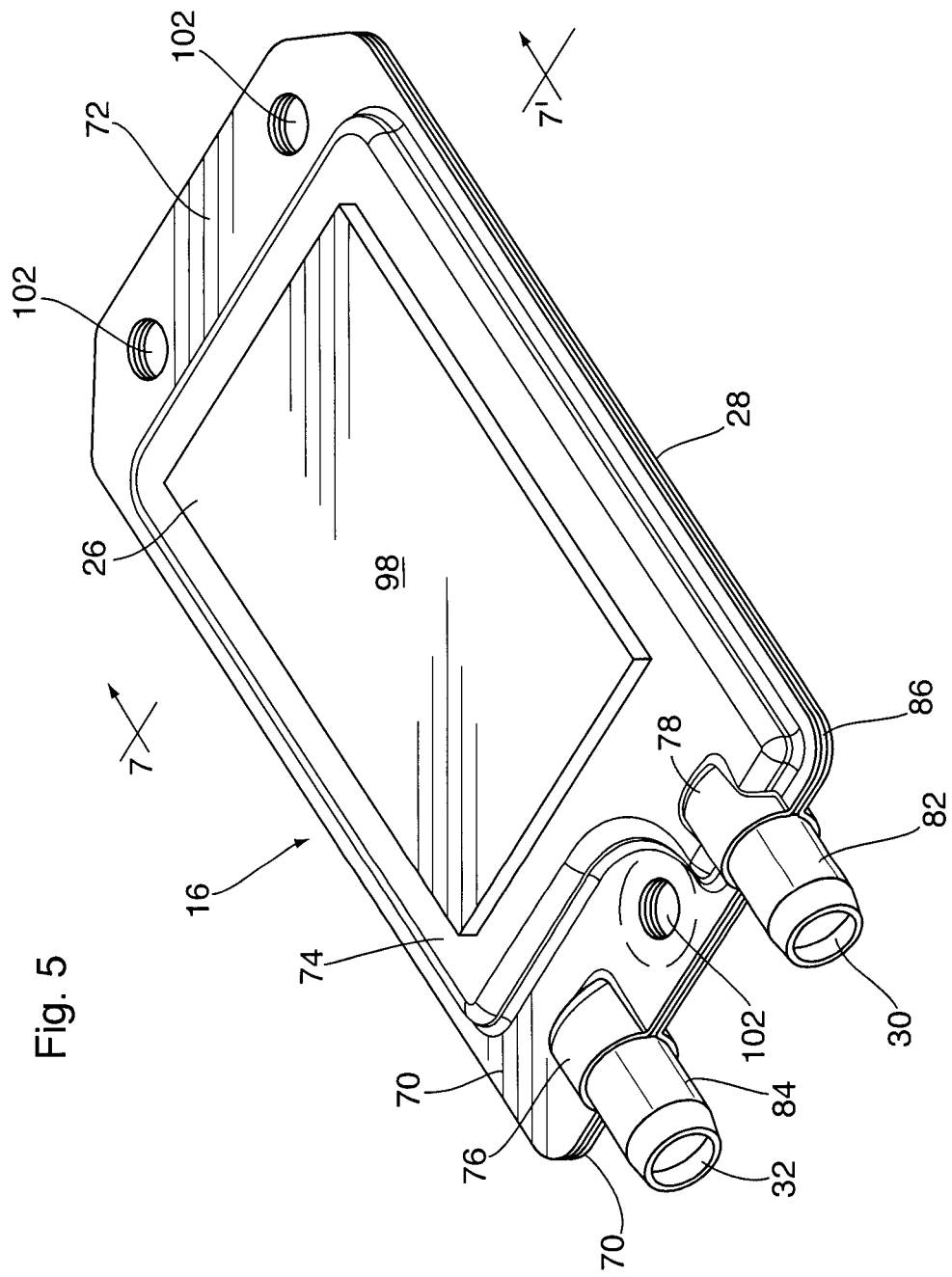
FIG. 5 is a top perspective view of one of the fluid-carrying heat exchanger panels of the heat exchanger assembly of FIG. 1.
Figure 6:
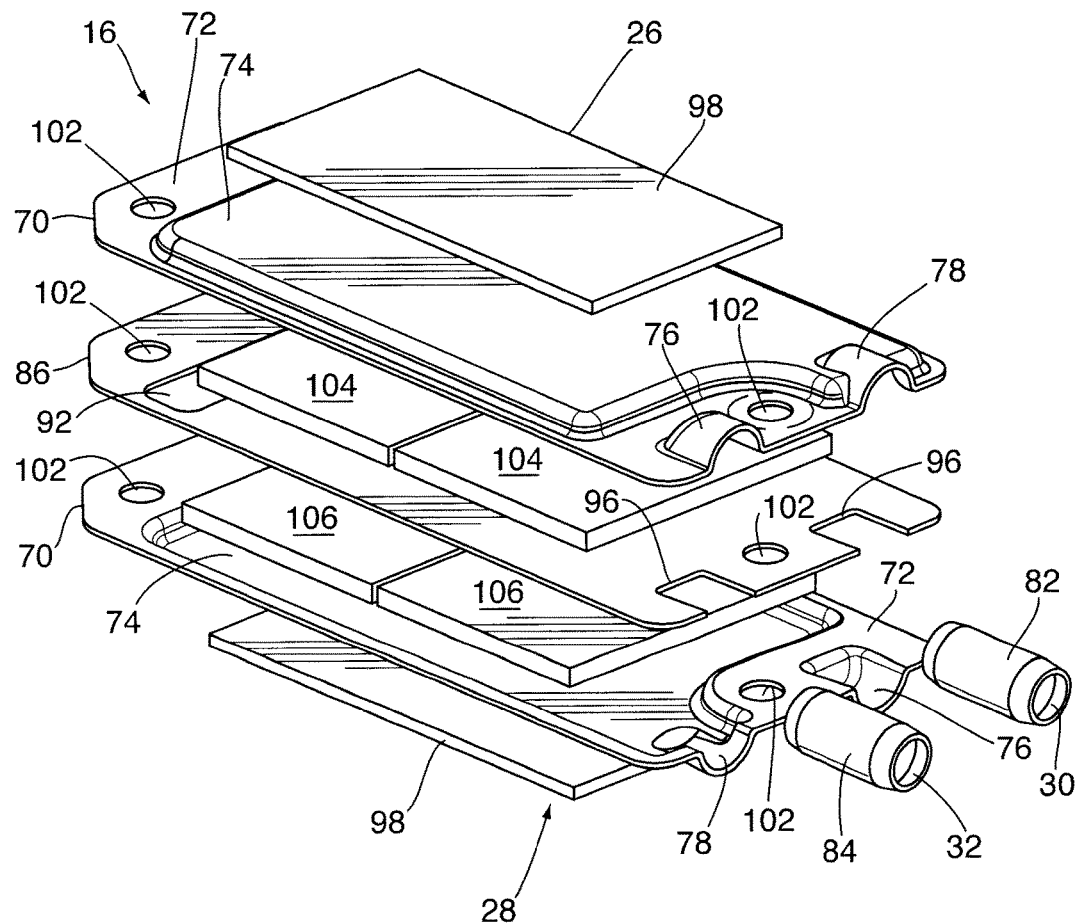
FIG. 6 is an exploded perspective view of the fluid-carrying heat exchanger panel of FIG. 5.
Figure 7:
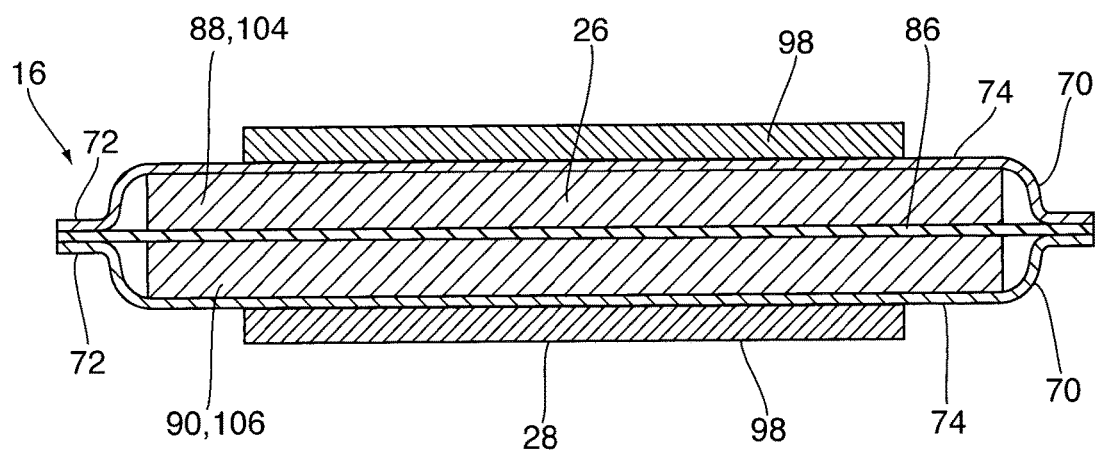
FIG. 7 is a cross-section through the fluid-carrying heat exchanger panel of FIG. 5, taken along line 7-7 of FIG. 5.

Referring now to FIGS. 5 to 7, each of the fluid-carrying panels 16 is constructed from two types of plates. Firstly, the fluid-carrying panels 16 include a pair of outer plates 70, each of which has a planar peripheral flange 72 and a raised central portion 74. When a pair of outer plates 70 is sealingly bonded together in face-to-face opposed relation along their outer peripheral flanges 72, the raised central portions 74 of the outer plates 70 define the fluid flow passageway 34.

Each of the outer plates 70 also includes a pair of bulges 76, 78 located along one of the peripheral edges of the plate 70, referred to herein as first bulge 76 and second bulge 78. Both bulges 76, 78 are open along the peripheral edge of the plate 70 and form a channel extending inwardly from the peripheral edge to the raised central portion 74.

In the present embodiment, the channels formed by bulges 76, 78 are semi-circular, such that when two outer plates 70 are joined together in face-to-face opposed relation to one another, the bulges 76, 78 form cylindrical passages 80 which are open at the peripheral edge of the fluid-carrying panel 16 and extend inwardly to the fluid flow passageway 34. These cylindrical passages 80 are sized and shaped to allow insertion of an end of an inlet or fitting 82, 84, and to allow the fitting 82, 84 to be closely and sealingly received inside the cylindrical passage 80, for example by brazing.

It can be seen from FIG. 5 that the planar peripheral flange 72 surrounds the first bulge 76 on all sides except along the peripheral edge of plate 70. Therefore, the first bulge 76 is separated from the raised central portion 74 of outer plate 70 by the peripheral flange 72. The second bulge 78, on the other hand, opens into the raised central portion 74.

When a pair of plates 70 is joined together in face-to-face opposed relation, the first bulge 76 of one outer plate 70 will combine with the second bulge 78 of the opposed outer plate 70 to form a cylindrical passage 80. Thus, in each of the cylindrical passages 80, flow communication between the peripheral edge of the fluid-carrying panel 16 and the fluid flow passageway 34 is provided through the second bulge 78 of each outer plate, which opens into the raised central portion 74 of one of the outer plates 70.

The fluid-carrying panels 16 also include a flat middle plate 86. As shown in the cross-sectional view of FIG. 8, the middle plate 86 is sandwiched between the two outer plates 70, with the outer peripheral edges of middle plate 86 sealingly joined to the peripheral flanges 72 of the outer plates 70. Thus, the middle plate 86 separates the fluid flow passageway 34 into two portions, along a plane which is parallel to the first and second surfaces 26, 28 of the fluid-carrying panel 16.

A first portion of the fluid flow passageway 34, referred to herein as the inlet portion 88, extends along the inner surface of the first sidewall 25 of the panel 16, opposite to the first surface 26, and is in thermal contact with the first surface 18 of the electronic component 12, i.e. the surface of component 12 having greater cooling requirements. The inlet portion 88 of fluid flow passageway 34 is in flow communication with the inlet fitting 82 through the second bulge 78 of one of the outer plates 70, the second bulge 78 being located on the same side of middle plate 86 as the inlet portion 88 of fluid flow passageway 34.

A second portion of the fluid flow passageway 34, referred to herein as the outlet portion 90, extends along the inner surface of the second sidewall 27 of the panel 16, opposite to the second surface 28, and is in thermal contact with the second surface 20 of the electronic component 12, i.e. the surface of component 12 having lesser cooling requirements. The outlet portion 90 of fluid flow passageway 34 is in flow communication with the outlet fitting 84 through the second bulge 78 of one of the outer plates 70, the second bulge 78 being located on the same side of middle plate 86 as the outlet portion 90 of fluid flow passageway 34.

Thus, it can be seen that the middle plate 86 divides the fluid flow passageway 34 into an inlet portion 88 along the first sidewall 25 of the fluid-carrying panel 16, and an outlet portion 90 along the second sidewall 27 of the fluid-carrying panel 16. The inlet opening 30 of the fluid carrying panel 16 is in flow communication with the inlet portion 88 of the fluid flow passageway 34, and the outlet opening 32 of the fluid carrying panel 16 is in flow communication with the outlet portion 90 of the fluid flow passageway 34.

The middle plate 86 is provided with a communication opening 92 proximate to an end of the plate 86 which is distal to the inlet and outlet openings 30, 32. The communication opening 92 permits fluid flow from the inlet portion 88 to the outlet portion 90 of fluid flow passageway 34. Thus, in operation, the inlet portion 88 of fluid flow passageway 34 will receive coolant directly from inlet manifold 36, and this coolant will become heated by thermal contact with the first surface 18 of the electronic component 12 as it flows through the inlet portion 88 of fluid flow passageway 34 from the inlet 30 toward the communication opening 92 of the middle plate 86. The outlet portion 90 of the fluid flow passageway 34 will receive this heated coolant from the communication opening 92, and the coolant will flow through the outlet portion 90 of the fluid flow passageway 34 from the communication opening 92 to the outlet 32, becoming further heated by thermal contact with the second surface 20 of the electronic component 12. Thus, it can be seen that the capacity of the coolant to remove heat from the electronic component 12 will be greater in the inlet portion 88 than in the outlet portion 90, thereby providing the fluid-carrying panels 16 with greater cooling capacity along the first sidewall 25 than along the second sidewall 27.

It will be appreciated that at least the middle panels 16B and 16C will be constructed as described above, so as to provide them with greater cooling capacity along their first surfaces 26, since the first surface 26 of each of the middle panels 16B, 16C will be in thermal contact with the first surface 18 of one of the electronic components 12, while the second surface 28 of each of the middle panels 16B, 16C will be in thermal contact with the second surface 20 of one of the electronic components 12.

However, the two end panels 16A, 16D do not necessarily require this differential cooling capacity since they are in thermal contact with only one of the surfaces of the electronic component, i.e. the end panel 16A has one of its surfaces 26, 28 in thermal contact with the first surface 18 of one of the endmost electronic components 12, and the opposite end panel 16D has one of its surfaces 26, 28 in thermal contact with the second surface 20 of the other endmost electronic component 12. Therefore, the two end panels 16A, 16D may be of a different construction, and without a middle plate 86 to divide the fluid flow passageway 34. However, in the interests of reducing complication and minimizing the number of different plates, all the fluid-carrying panels 16 may have the same construction, as described above.

At the end of middle plate 86 proximate to the inlet and outlet openings 30, 32, the middle plate 86 may be provided with notches 94, 96 which will extend around the bulges 76, 78 and the cylindrical passages 80 once the panels 16 are assembled.

To improve thermal contact between the fluid-carrying panels 16 and the electronic components 12, the panels 16 may further comprise heat sinks 98, which define the first and second surfaces 26, 28 along which the panels 16 are in contact with the electronic components 12. Each heat sink 98 may comprise a flat metal plate which is relatively thicker than the metal comprising the outer plates 70. The heat sink 98 and outer plate 70 are fixed together in intimate thermal contact with one another, for example by brazing. After the fluid-carrying panels 16 are assembled with the heat sinks 98 secured to the outer plates 70, the heat sinks 98 may be subjected to further processing so as to ensure their flatness. For example, the heat sinks 98 forming part of panels 16 may be subjected to milling, grinding and/or planing to ensure that the first and second surfaces 26, 28 defined by the heat sinks 98 are flat and parallel to one another. This helps to ensure that the first and second surfaces 26, 28 will be in intimate thermal contact with the first and second surfaces 18, 20 of the electronic components 12, thereby maximizing heat transfer from the electronic components 12 to the coolant circulating in the fluid flow passageway 34.

The heat sink 98 is approximately the same shape and size as the surfaces 18, 20 of the electronic component 12, and also covers substantially the entire fluid flow passageway 34 defined by raised central portions 74 of outer plates 70, thereby maximizing the area across which heat can be transferred from the electronic component 12 to the coolant.

To further enhance thermal contact, the interface between the fluid-carrying panels 16 and the electronic component 12 may be provided with a thin layer of a thermal interface material (TIM), which may comprise a thermally conductive grease, wax or metallic material.

Thermal contact may also be enhanced by applying compression to the assembly 10 in order to bring the fluid-carrying panels 16 into intimate thermal contact with the electronic components 12 along their respective first and second surfaces 18, 20 and 26, 28. This is accomplished by applying a compressive force to the assembly in the direction of the longitudinal axis L.

In the present embodiment, compression is applied by a plurality of longitudinally extending tie rods 100 passing through holes 102 in the fluid-carrying panels 16, outside the area of the fluid flow passageway 34. In the illustrated embodiment, two such holes 102 are provided along the top edge of each of the fluid-carrying panels 16, i.e. the edges which are distal from the manifold structure 44. In addition, one hole 102 may be provided along the bottom edge of each fluid-carrying panel 16. The tie rods 100 may be threaded and provided with nuts (not shown) to apply compression to the assembly 10. It will be appreciated that the compression will improve the thermal contact between the fluid-carrying panels 16 and the electronic components 12, and the compression may be sufficiently high so as to squeeze some of the TIM from the interface area between panels 16 and components 12, such that the TIM will still eliminate any voids between the panels 16 and components 12, while being sufficiently thin in other areas so as to minimize its insulating effect.

Although tie rods 100 are used to apply compression in the present embodiment, it will be appreciated that other means may be used to apply compression. For example, the assembly may be compressed by the use of longitudinally extending straps.

Assembly is performed by first assembling the fluid-carrying panels 16 and the manifold structure 44 as separate components. Then, the tubular inlet and outlet fittings 82, 84 of panels 16 are inserted into the respective inlet and outlet openings 52, 54 of the top plate 58 of manifold structure 44, with a sealed connection between fittings 82, 84 and openings 52, 54 being provided by resilient O-rings 61 as described above, which may either be fitted to the fittings 82, 84 or to the openings 52, 54, for example in the manner shown in FIG. 4. The electronic components 12 are received between the fluid-carrying panels 16, with TIM applied to the contacting surfaces 18, 20 of the electronic components 12 and/or the contacting surfaces 26, 28 of the fluid-carrying panels 16. The tie rods 100 are then inserted through the holes 102 and compression is applied to the assembly as described above.

It will be appreciated that the resilient sealing provided by O-rings 61 permits some longitudinal play in the positioning of the fluid-carrying panels 16 along the longitudinal axis L. In particular, the resilient connection between panels 16 and manifold structure 44 permits some pivoting movement back and forth along the axis L along the top edges of the panels 16 (as indicated by the curved arrows in FIG. 1), permitting assembly of the panels 16 with the electronic components 12 between them, followed by compression of provided by the tie rods 100 so as to bring the panels 16 and the electronic components 12 into intimate thermal contact with one another.

It will be appreciated that the desired pivoting movement of the panels 16 may be achieved in a heat exchanger construction where the fittings 82, 84 are rigidly connected to and sealed inside the openings 52, 54, for example by brazing. In such an alternate construction, the tubular fittings 82, 84 may be somewhat flexible in order to permit some limited back and forth pivoting movement along the axis L at the top edges of the panels 16, as explained above.

As shown in the cross-section of FIG. 7, the inlet and outlet portions 88, 90 of the fluid flow passageway 34 may be provided with turbulence-enhancing inserts 104, 106 such as turbulizers or corrugated fins. Each turbulence-enhancing insert 104, 106 is received between the raised central portion 74 of one of the outer plates 70 and the middle plate 86, and may be secured to one or both of the plates 70, 86 by brazing or welding. As used herein, the terms "corrugated fin" and "turbulizer" are intended to refer to corrugated turbulence-enhancing inserts having a plurality of axially-extending ridges or crests connected by sidewalls, with the ridges being rounded or flat. As defined herein, a "fin" has continuous ridges whereas a "turbulizer" has ridges which are interrupted along their length, so that axial flow through the turbulizer is tortuous. Turbulizers are sometimes referred to as offset or lanced strip fins, and examples of such turbulizers are described in U.S. Pat. No. Re. 35,890 (So) and U.S. Pat. No. 6,273,183 (So et al.). The patents to So and So et al. are incorporated herein by reference in their entireties.

Figure 8:
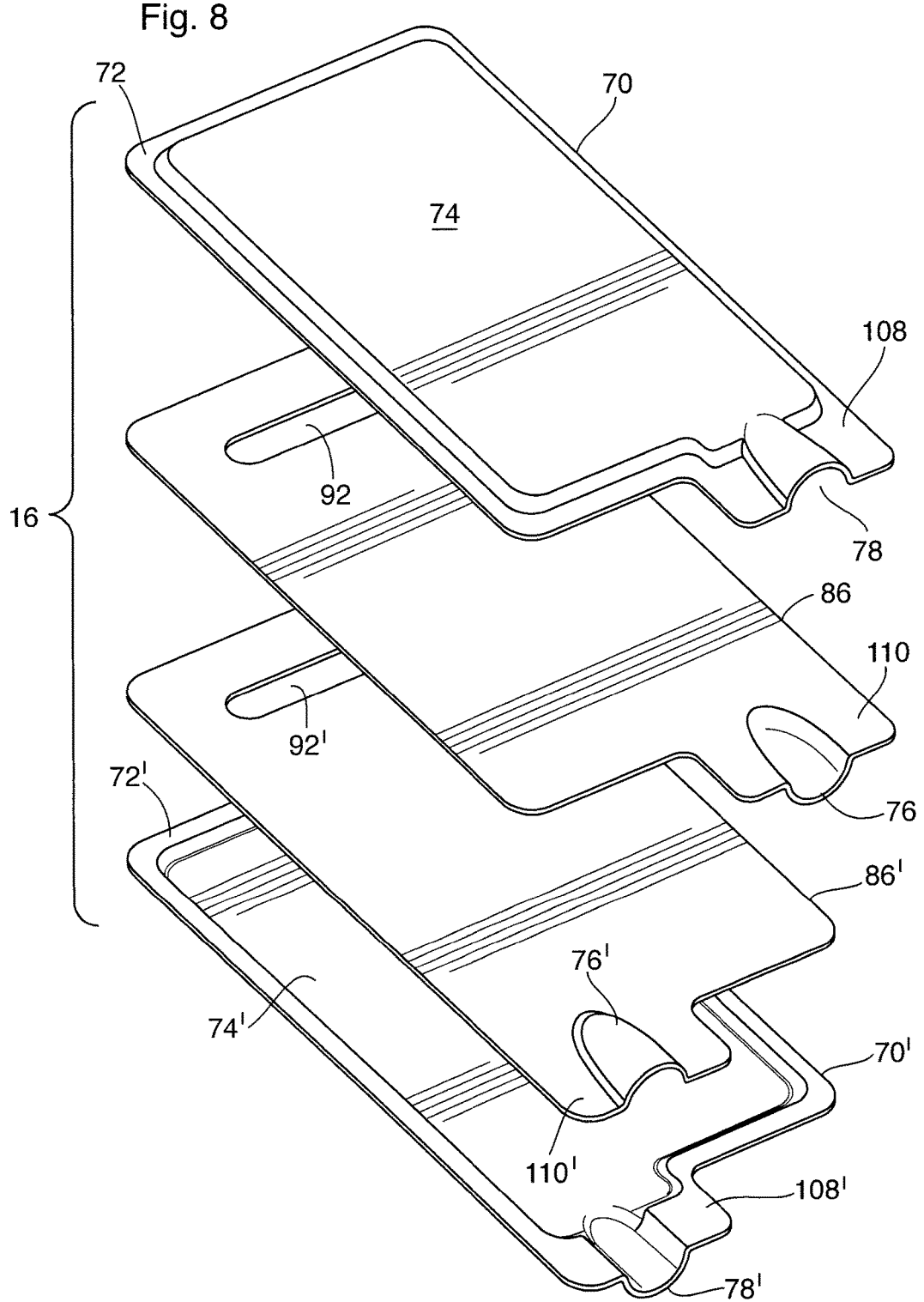
FIG. 8 is an exploded perspective view of a fluid-carrying heat exchanger panel according to an alternate embodiment.

FIG. 8 illustrates an alternate construction of the fluid-carrying panel 16, in which like elements are identified by like reference numerals and the above description of these like elements applies to the embodiment of FIG. 8, unless otherwise indicated.

In the fluid-carrying panel 16 of FIG. 8, there are two outer plates labeled 70 and 70'. Plate 70 is the top plate in FIG. 8, and has a planar peripheral flange 72 and a raised central portion 74. Outer plate 70 also includes a bulge 78 extending inwardly from the peripheral edge of the plate 70 and communicating with the raised central portion 74. The bulge 78 is located in an extension portion 108 of the plate 70. In the orientation shown in FIG. 8, the extension portion 108 and bulge 78 are located on the right hand side of plate 70.

The other outer plate 70' is the bottom plate in FIG. 8, and includes a planar peripheral flange 72', a raised central portion 74', and a bulge 78' extending inwardly from the peripheral edge of plate 70' and communicating with the raised central portion 74'. The bulge 78' is located in an extension portion 108' of the plate 70'. In the illustrated embodiment the two outer plates 70, 70' are identical to one another, although this is not necessary in all embodiments.

Instead of a single middle plate 86, the fluid-carrying panel of FIG. 8 includes two middle plates labeled 86 and 86', with middle plate 86 being located on top of middle plate 86'. Middle plate 86 is flat, except that it includes a bulge 76 which is formed in an extension portion 110 of the middle plate 86 and extends inwardly from an edge thereof. Middle plate 86 also has a communication opening 92 as described above, in the form of an elongate slot extending across the width of middle plate 86, with the bulge 76 and the communication opening 92 being located proximate to opposite ends of middle plate 86.

Middle plate 86' is also flat except for bulge 76' which is formed in extension portion 110' of middle plate 86' and extends inwardly from an edge thereof. Middle plate 86' has a communication opening 92' in the form of an elongate slot extending across the width of middle plate 86', with the bulge 78' and the communication opening 92' being located proximate to opposite ends of middle plate 86'. In the illustrated embodiment the two middle plates 86, 86' are identical to one another, although this is not necessary in all embodiments.

The fluid-carrying panel 16 of FIG. 8 is assembled by laying middle plate 86 directly on top of middle plate 86' with openings 92, 92' in alignment, and sandwiching the peripheral edges of the middle plates 86, 86' between the peripheral flanges 72, 72' of outer plates 70, 70'. The bulges 78, 76 of respective plates 70, 86 combine to form one of the cylindrical passages 80, and the bulges 78', 76' of respective plates 70', 86' combine to form the other cylindrical passage 80. In cross-section, the resulting structure of panel 16 has an appearance similar to that shown in FIG. 7, with the pair of middle plates 86, 86' lying flat against one another and separating the fluid flow passageway into two portions. As with the embodiments discussed above, the fluid-carrying panel 16 of FIG. 8 may be assembled by brazing.

Although not shown in FIG. 8, the plates 70, 70', 86, 86' of the fluid-carrying panel 16 of FIG. 8 may be provided with through holes 102 proximate to their peripheral edges in order to receive longitudinally extending tie rods 100 (not shown). Also, the fluid-carrying panel 16 of FIG. 8 may be provided with a heat sink 98 on the outer surface of one or both of the outer plates 70, 70'. Also, each of the cylindrical passages 80 may be provided with tubular fittings 82, 84 as described above.

Figure 9:
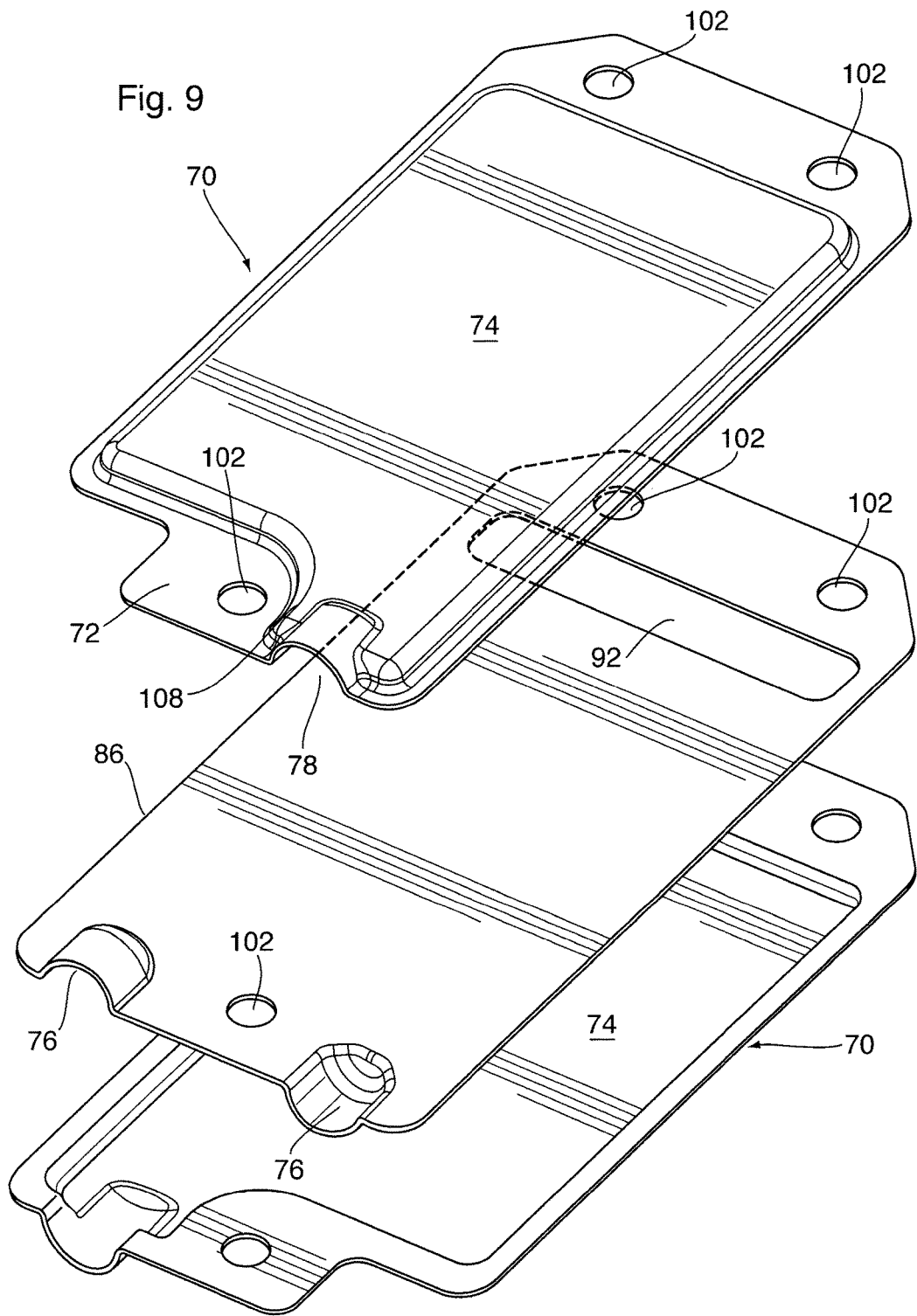
FIG. 9 is a perspective views of a fluid-carrying heat exchanger panel according to another alternate embodiment.
Figure 10:
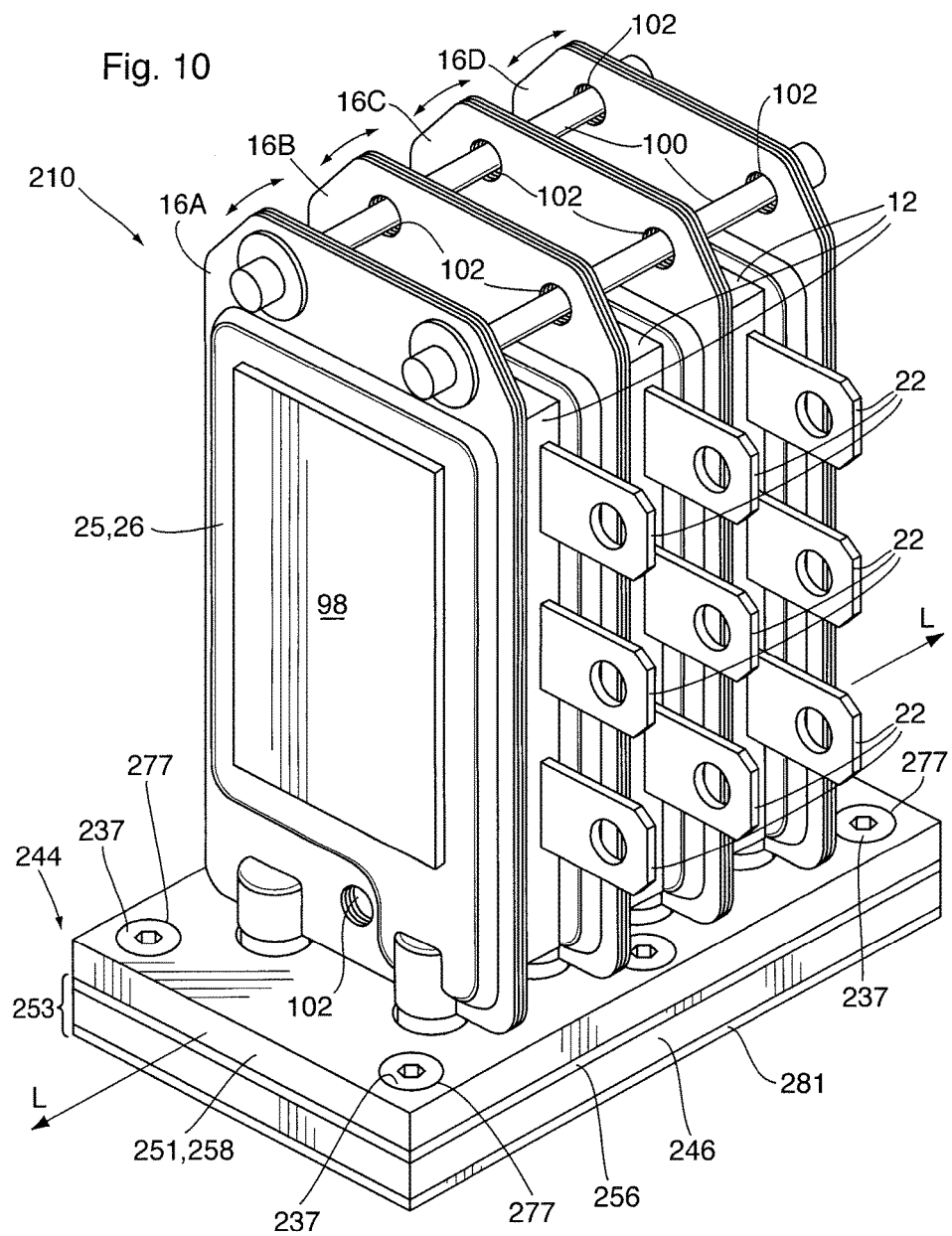
FIG. 10 is a perspective view of a heat exchanger assembly according to a second embodiment described herein.

FIGS. 9 and 10 illustrate another alternate construction of the fluid-carrying panel 16, in which like elements are identified by like reference numerals and the above description of these like elements applies to the embodiment of FIGS. 9 and 10, unless otherwise indicated.

The fluid-carrying panel 16 of FIGS. 9 and 10 likewise includes two outer plates 70 having a planar peripheral flange 72 and a raised central portion 74, one of which is shown in FIG. 9. The outer plate 70 includes a bulge 78 extending inwardly from the peripheral edge of the plate 70 and communicating with the raised central portion 74, the bulge 78 being located in an extension portion 108 of the plate 70.

Instead of a pair of middle plates 86 as in the embodiment of FIG. 8, the fluid-carrying panel of FIGS. 9 and 10 includes only a single middle plate 86, which is shown in isolation in FIG. 10. The middle plate 86 includes a pair of bulges 76, one of which is formed upwardly from the plane of the plate 86, and the other of which is formed downwardly from the plane of the plate 86. Therefore, when assembled between a pair of outer plates 70, each of the bulges 76 of middle plate 86 combines with one of the bulges 78 in an adjacent outer plate 70 to form a cylindrical passage 80. Thus, as in the embodiment of FIG. 8, each cylindrical passage 80 in the embodiment of FIGS. 9 and 10 is formed by the bulges 78, 76 in an outer plate 70 and the adjacent middle plate 86, rather than in the opposed outer plates 70. The middle plate 86 of FIG. 9 also has a communication opening 92 as described above.

The following is a description of a heat exchanger assembly 210 according to a second embodiment, with reference to FIGS. 11-15. Like reference numerals are used to refer to like elements in the following description. The heat exchanger assembly 210 comprises the manifold structure 244 in combination with a plurality of fluid-carrying panels 16 and electronic components 12 as described with reference to the first embodiment. The above description of the fluid-carrying panels 16 and electronic components 12 applies to the second embodiment, and the following description will focus on the structure of the manifold structure 244.

The manifold structure 244 houses both an inlet manifold 236 and an outlet manifold 238, with the manifolds 236, 238 being comprised of respective slots 260, 262. The inlet manifold 236 is in flow communication with the inlet opening 30 of each of the middle fluid-carrying panels 16B, 16C, and therefore each of the middle panels 16B, 16C receives relatively cool coolant directly from the inlet manifold 236. The outlet manifold 238 is in flow communication with the outlet opening 32 of each of the middle panels 16B, 16C, and therefore the middle panels 16B, 16C discharge their heated coolant directly into the outlet manifold 238. The inlet manifold 236 is in flow communication with the inlet opening 30 of the first end panel 16A, but does not directly supply coolant to the second end panel 16D. Instead, the outlet opening 32 of the first end panel 16A is in flow communication with the inlet opening 30 of the second end panel 16D, such that the second end panel 16D receives coolant which has been discharged by the first end panel 16A.

The manifold structure 244 comprises a first portion 251 (also referred to as "top portion 251") and a second portion 253 (also referred to herein as "bottom portion 253"). The top portion 251 includes a plurality of apertures 252, 254 to receive the inlet and outlet fittings 82, 84 of the fluid-carrying panels 16, and comprises a top plate 258. The bottom portion 253 includes the inlet and outlet manifolds 236, 238; holes or connecting passages to provide communication between the manifolds and the apertures 252, 254 in the top portion 251; inlet and outlet ports 240, 242; and comprises three plates. In particular, the bottom portion 253 comprises a middle plate 256, a bottom plate 246, and a fitting plate 281. The top and bottom portions 251, 253 are sealingly joined together to form the manifold structure 244.

The four layers 281, 246, 256, 258 making up manifold structure 244 are sealingly secured together by screws 237. The bottom portion 253 may be provided as a subassembly, with the three layers (281, 246, 256) of bottom portion 253 being sealingly joined together by brazing.

Figure 11:
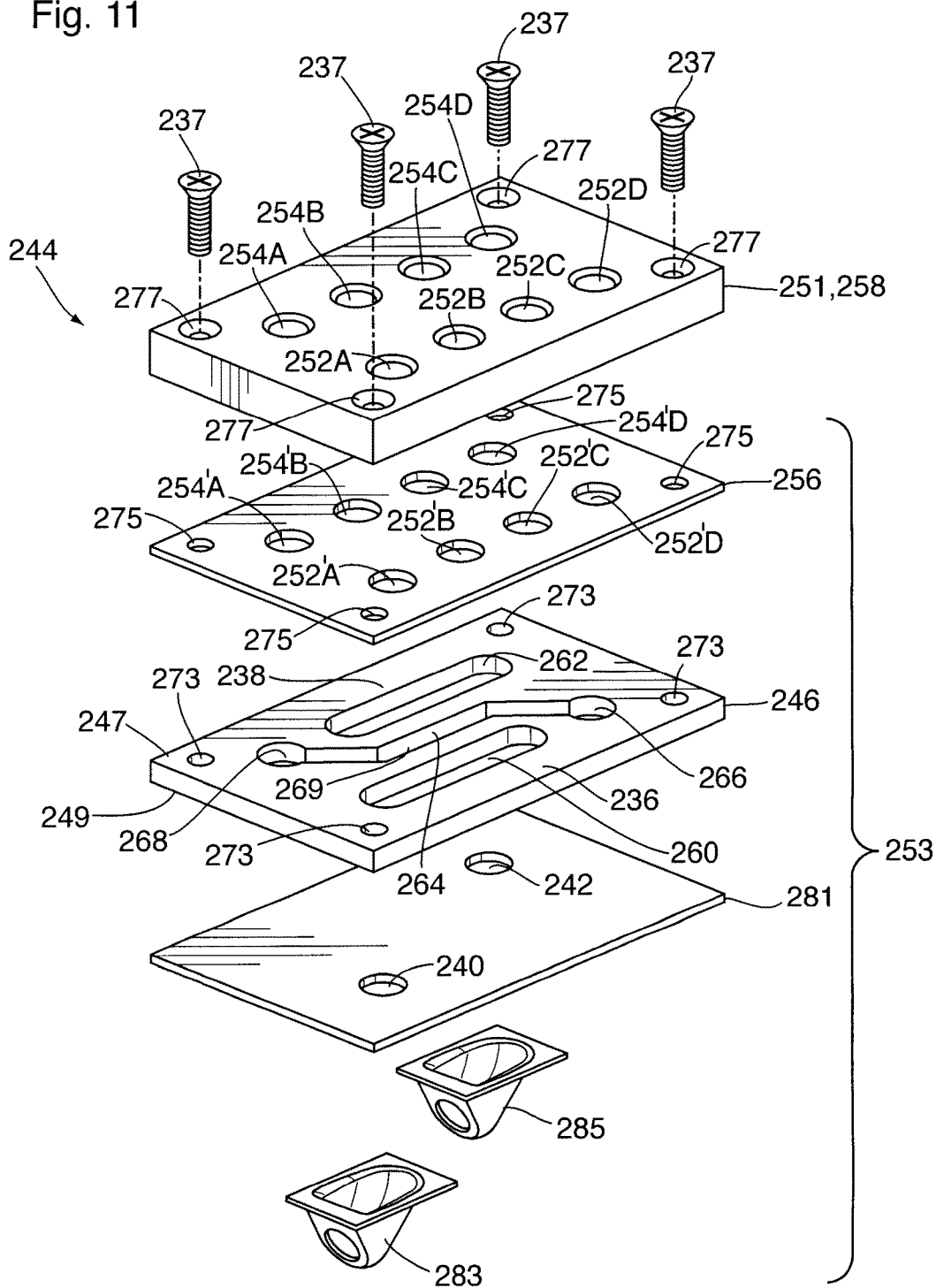
FIG. 11 is an exploded perspective view of the manifold structure of the heat exchanger assembly of FIG. 10.
Figure 11A:
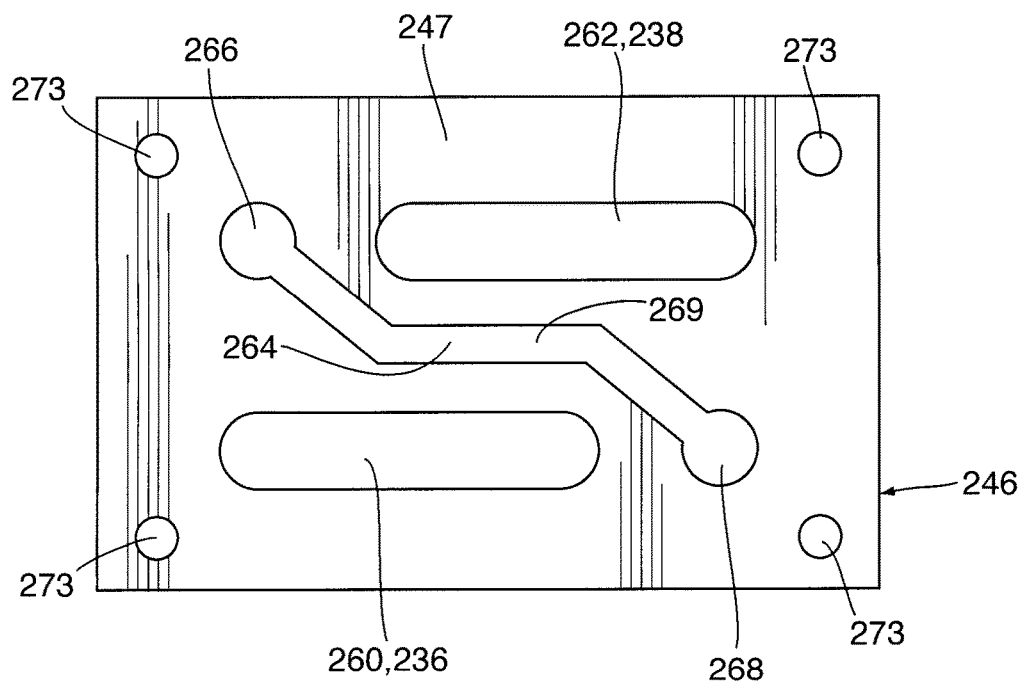
FIG. 11A is a top plan view of the bottom plate of the manifold structure of FIG. 11.

As shown in FIGS. 11 and 11A, the bottom plate 246 has a top face 247 and an opposite bottom face 249, and has a plurality of openings extending therethrough. It can be seen that the bottom plate 246 has a simpler structure than the corresponding bottom block 46 of the manifold structure 44 described above, and is also thinner.

The bottom plate 246 is provided with a pair of longitudinal slots extending therethrough along opposite sides of plate 246, namely first longitudinal slot 260 and second longitudinal slot 262, which are sometimes referred to herein as the "inlet slot 260" and "outlet slot 262" respectively. The bottom plate 246 is further provided with a third slot 264 extending therethrough, also referred to herein as "crossover slot 264". The crossover slot 264 extends generally diagonally across the bottom plate 246, having a central portion 269 located between slots 260, 262, and having first and second end portions 266, 268 which are aligned longitudinally with the inlet and outlet slots 260, 262, respectively. The bottom plate 246 is also provided with a plurality of threaded holes 273 to receive threaded fasteners such as screws 237.

The fitting plate 281 may be thinner than the bottom plate 246 and closes the open bottoms of the crossover slot 264 and the threaded holes 273. The fitting plate 281 includes two holes 240, 242 which are positioned to align with the respective inlet and outlet slots 260, 262 when the fitting plate 281 is sealingly joined to the bottom plate 246. The holes 240, 242 provide respective inlet and outlet ports on the bottom surface of the manifold structure 244. The holes 240, 242 are provided with respective inlet and outlet fittings 283, 285 which, in the present embodiment, are in the form of sloped-back fittings. However, it will be appreciated that the locations and types of fittings can be varied, depending on the requirements of any specific application.

The middle plate 256 may be thinner than bottom plate 246 and has a plurality of pairs of openings 252', 254' which are positioned to provide fluid flow communication with the inlet and outlet openings of fluid-carrying panels 16. Each inlet opening 252' and outlet opening 254' of middle plate 256 is assigned a character "A", "B", "C", or "D" in the following discussion, as in the embodiment described above.

The inlet openings 252'A, 252'B and 252'C of middle plate 256 are aligned with and in direct flow communication with the inlet slot 260, which is in flow communication with inlet port 240 defined by fitting plate 281. The fourth inlet opening 252'D is in direct flow communication with the second end portion 268 of the crossover slot 264, the end portion 268 having a rounded end which aligns with inlet opening 252'D of the middle plate 256.

Similarly, outlet openings 254'B, 254'C and 254'D of middle plate 256 are aligned with and in direct flow communication with the outlet slot 262, which is in flow communication with outlet port 242 defined by fitting plate 281. The first outlet opening 254'A of middle plate 256 is in direct flow communication with the first end portion 266 of crossover slot 264, the end portion 266 having a rounded end which aligns with outlet opening 254'A of the middle plate 256.

When the middle plate 256 and bottom plate 246 are sealed together, the middle plate 256 covers and seals the open top of the crossover slot 264, except for the rounded ends of end portions 266, 268 which are in alignment with openings 254'A and 252'D, respectively. Therefore, the crossover slot 264 provides direct fluid flow communication between the first outlet opening 254'A and the fourth inlet opening 252'D.

The top plate 258 functions primarily to receive the ends of inlet and outlet fittings of the cooling plates 16 and to provide fluid flow communication between the inlet and outlet openings of the fluid-carrying panels 16 and the bottom portion 253 of manifold structure 244. The top plate 258 has a plurality of pairs of inlet and outlet openings 252, 254 which are labeled 252A-D and 254A-D. The inlet and outlet openings 252A-D and 254A-D of top plate 258 are positioned to align with and to provide direct fluid flow communication with the respective inlet and outlet openings 252'A-D and 254'A-D of the middle plate 256. Therefore, the spacing and locations of openings 252, 254 of top plate 258 correspond to those of the middle plate 256. The top plate 258 is also provided with a plurality of unthreaded through holes 277 to receive threaded fasteners 237, with the holes 277 of top plate 258 aligning with holes 275 of middle plate 256 and holes 273 of bottom plate 246.

The inlet and outlet openings 252, 254 of the top plate 258 are adapted to receive tubular inlet and outlet fittings of a fluid-carrying panel 16, such as tubular fittings 82, 84 described above. As in the first embodiment, the openings 252, 254 of top plate 258 are adapted to be sealed to fittings 82, 84 through the use of resilient seals, which permit some movement of the top ends of the fluid-carrying panels 16, in exactly the same manner as discussed above with reference to the first embodiment.

Figure 14:
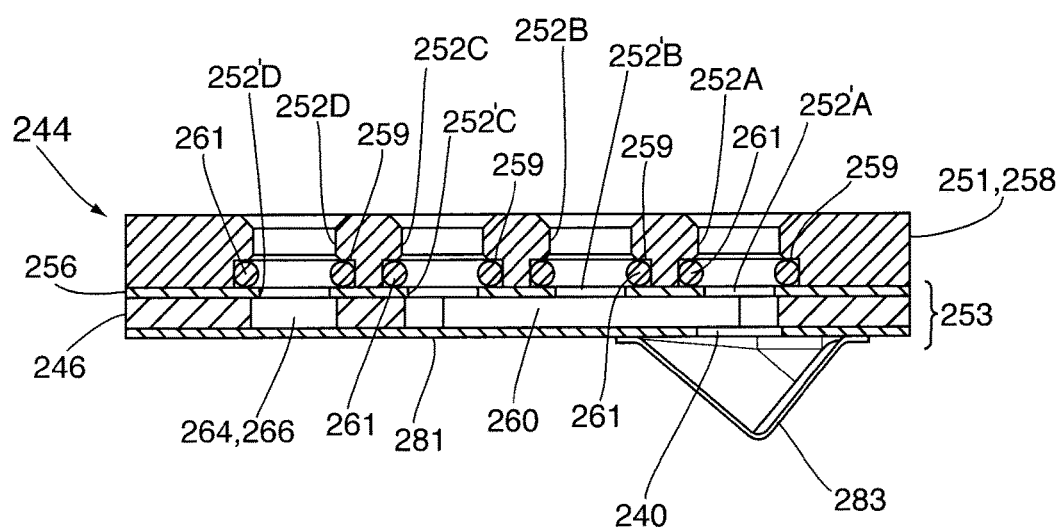
FIG. 14 is a cross-section along line 14-14' of FIG. 12.

As shown in the cross-section of FIG. 14, each inlet opening 252 in top plate 258 is surrounded by an annular recess 259 at the lower surface of top plate 258 (i.e. the surface which contacts the middle plate 256). Although not shown in FIG. 14, outlet openings 254 have an identical appearance, and are also provided with annular recesses 259. The annular recess 259 has a rectangular or square cross-section and is adapted to receive a resilient sealing element such as resilient O-ring 261. When the manifold structure 244 is assembled with the top portion 251 secured to the bottom portion 253 by screws 237, the annular recess 259 and the top surface of the middle plate 256 form an annular groove in which the O-ring 261 is compressed such that it projects radially inwardly from the walls of openings 252. Thus, when fittings 82, 84 are inserted into the openings 252, 254, each O-ring 261 contacts and forms a seal with the outer surface of one of the fittings 82, 84.

In addition, the top edges of holes 252, 254 may be chamfered so as to ease insertion of the fittings 82, 84 of the fluid-carrying panels.

As shown in FIG. 14, the openings 252' in the middle plate 256 have a diameter which is smaller than that of openings 252 in the top plate 258, and smaller than the outside diameter of the fittings 82. Although not shown in FIG. 14, the openings 254' in the middle plate 256 have a diameter which is smaller than that of openings 254 in the top plate 258, and smaller than the outside diameter of the fittings 84. With this arrangement, the middle plate 256 acts as a stop and prevents over-insertion of the fittings 82, 84 into the holes 252, 254 of top plate 258.

In another embodiment, the bottom plate 246 of the embodiment shown in FIGS. 11 to 15 may be replaced by a bottom plate 246' as shown in FIG. 16, with all other elements of the manifold structure remaining the same as in FIGS. 11-15. In FIG. 16, like elements of bottom plate 246' are identified by like, primed reference numerals. Bottom plate 246' does not include a crossover slot 264. Instead, the inlet slot 260' is extended so that it will provide direct fluid flow communication with all the inlet openings 252' of middle plate 256, and the outlet slot 262 is similarly extended to provide direct fluid flow communication with all the outlet openings 254' of middle plate 256. Similar to bottom plate 246 described above, bottom plate 246' has a top face 247' and a plurality of threaded holes 273'.

As mentioned above, the heat exchangers described herein may include components which are assembled by brazing. Therefore, in some embodiments the above-described components of the heat exchangers described herein may be comprised of brazeable metals and their alloys, including aluminum. In some embodiments at least some of the components making up the heat exchanger can be formed from non-metallic materials, such as plastics.

Although the invention has been described in connection with certain embodiments, it is not limited thereto. Rather, the invention includes all embodiments which may fall within the scope of the following claims.

What is claimed is:

1. A heat exchanger for cooling a plurality of heat-generating components, each having a first surface and a second surface, wherein the first and second surfaces of each said heat-generating component are substantially flat and planar, and wherein the heat-generating components are arranged in spaced, parallel relation to one another, with spaces being provided between adjacent pairs of said heat-generating components;

the heat exchanger comprising at least three flat, fluid-carrying panels, including a first end panel, a second end panel, and at least one middle panel, wherein each said fluid-carrying panel has a first surface, an opposed second surface, and an inlet opening, an outlet opening, and a fluid-flow passageway in flow communication with the inlet and outlet openings;

wherein each of the at least one middle panels is adapted to be at least partially received in one of said spaces with its first surface in thermal contact with the first or second surface of one said heat-generating component, and with its second surface in thermal contact with the first or second surface of another said heat-generating component; and wherein each of the first end panel and the second end panel is adapted to be in thermal contact with the first or second surface of an endmost one of said heat-generating components;

the heat exchanger further comprising an inlet manifold which is in flow communication with the inlet opening of each of the middle panels, and an outlet manifold which is in flow communication with the outlet opening of each of the middle panels;

wherein the inlet manifold is in flow communication with the inlet opening of the first end panel, and the outlet manifold is in flow communication with the outlet opening of the second end panel; and wherein the outlet opening of the first end panel is in direct flow communication with the inlet opening of the second end panel, such that the inlet opening of the second end panel receives fluid only from the outlet opening of the first end panel.

2. The heat exchanger of claim 1, wherein each of the fluid-carrying panels has a tubular inlet fitting and a tubular outlet fitting, and wherein the inlet manifold comprises a plurality of inlet openings adapted to sealingly receive the tubular inlet fittings of the fluid-carrying panels, and wherein the outlet manifold comprises a plurality of outlet openings adapted to sealingly receive the tubular outlet fittings of the fluid-carrying panels, wherein the tubular inlet and outlet fittings are sealingly connected to the inlet and outlet openings of the manifolds by resilient sealing members; and wherein a resilient sealing member is provided between each of the inlet openings of the inlet manifold and one of the tubular inlet fittings, and between each of the outlet openings of the outlet manifold and one of the tubular outlet fittings.

3. The heat exchanger of claim 1, wherein the fluid flow passageways of the middle panels are divided into a first portion along the first surface of the middle panel, and a second portion along the second surface of the middle panel, wherein the inlet opening is in direct flow communication with the first portion, and the outlet opening is in direct flow communication with the second portion;

wherein the first and second portions of the fluid flow passageway are separated from one another by a partition plate, and wherein the partition plate includes an opening to permit fluid flow between the first and second portions of the fluid flow passageway.

4. The heat exchanger of claim 1, wherein each of the fluid-carrying panels further comprises a heat sink along each of its first and second surfaces, wherein the heat sink comprises a flat plate which is optionally subjected to a flattening operation after assembly of the fluid-carrying panels.

5. The A heat exchanger for cooling a plurality of heat-generating components, each having a first surface and a second surface, wherein the first and second surfaces of each said heat-generating component are substantially flat and planar, and wherein the heat-generating components are arranged in spaced, parallel relation to one another, with spaces being provided between adjacent pairs of said heat-generating components;

the heat exchanger comprising at least three flat, fluid-carrying panels, including a first end panel, a second end panel, and at least one middle panel, wherein each said fluid-carrying panel has a first surface, an opposed second surface, and an inlet opening, an outlet opening, and a fluid-flow passageway in flow communication with the inlet and outlet openings;

wherein each of the at least one middle panels is adapted to be at least partially received in one of said spaces with its first surface in thermal contact with the first or second surface of one said heat-generating component, and with its second surface in thermal contact with the first or second surface of another said heat-generating component;

wherein each of the first end panel and the second end panel is adapted to be in thermal contact with the first or second surface of an endmost one of said heat-generating components;

wherein each of the fluid-carrying panels has an inlet fitting and an outlet fitting, and wherein the inlet manifold and the outlet manifold are both provided in a manifold structure, comprising:

a first portion including a plurality of apertures adapted to sealingly receive ends of the inlet and outlet fittings of the fluid-carrying panels, the first portion comprising one or more plates;

a second portion including the inlet and outlet manifolds, an inlet port in flow communication with the inlet manifold, an outlet port in flow communication with the outlet manifold, and holes providing communication between the manifolds and the apertures in the top portion, the second portion comprising one or more plates;

wherein the first and second portions are sealingly joined together to form the manifold structure.

6. The heat exchanger of claim 5, wherein the first portion comprises a top plate and the second portion comprises at least a middle plate and a bottom plate;

wherein the top plate comprises said plurality of apertures adapted to sealingly receive the ends of the inlet and outlet fittings, wherein said apertures extend through the top plate and are arranged in pairs; and wherein the inlet and outlet fittings are tubular, and wherein the apertures in the top plate are each provided with an annular recess adapted to receive a resilient sealing element.

7. The heat exchanger of claim 6, wherein the second portion further comprises a fitting plate, and wherein:

(a) the bottom plate includes a first longitudinal slot, a second longitudinal slot, and a third slot, each of which extends through the bottom plate, wherein the first and second longitudinal slots extending along opposite sides of the bottom plate, and the third slot extends generally diagonally across the bottom plate, the third slot having a central portion located between the first and second longitudinal slots, and having first and second end portions aligned longitudinally with the respective first and second longitudinal slots;

(b) the middle plate having a plurality of openings extending through the middle plate and arranged in pairs, each of the openings in the middle plate being positioned to align with one of the apertures in the top plate, and each of the openings in the middle plate being aligned with one of the first longitudinal slot, the second longitudinal slot, and one of the end portions of the third slot of the bottom plate, wherein the middle plate covers and seals an open top of the third slot, other than the end portions which are aligned with the openings in the middle plate;

(c) the fitting plate closes an open bottom of the third slot, wherein the inlet port of the manifold structure comprises a first hole in the fitting plate, the first hole being in alignment with the first longitudinal slot; and the outlet port of the manifold structure comprises a second hole in the fitting plate, the second hole being in alignment with the second longitudinal slot;

wherein the first hole and the second hole of the fitting plate are respectively provided with an inlet fitting and an outlet fitting.

8. The heat exchanger of claim 7, wherein the apertures in the top plate comprise a plurality of inlet apertures and a plurality of outlet apertures, wherein the inlet apertures and the outlet apertures are arranged in two rows which are transversely spaced apart from one another;

the openings in the middle plate comprise a plurality of inlet openings and a plurality of outlet openings, with each of the inlet apertures in the top plate being concentrically aligned with one of the inlet openings in the middle plate, and with each of the outlet apertures in the top plate being concentrically aligned with one of the outlet openings in the middle plate;

one of the inlet openings in the middle plate is aligned with the second end portion of the third slot in the bottom plate, and the remaining inlet openings in the middle plate being aligned with the first longitudinal slot; and one of the outlet openings in the middle plate is aligned with the first end portion of the third slot in the bottom plate, and the remaining outlet openings in the middle plate being aligned with the second longitudinal slot;

wherein the openings in the middle plate have a diameter which is smaller than a diameter of the apertures in the top plate and smaller than an outside diameter of the inlet and outlet fittings.

9. The heat exchanger of claim 8, wherein said one inlet opening is located proximate to a first end of the middle plate and said one outlet opening is located proximate to a second end of the middle plate.

10. The heat exchanger of claim 5, wherein the second portion of the manifold structure is provided as a brazed subassembly.

11. The heat exchanger of claim 5, wherein the first portion and the second portion of the manifold structure are sealingly joined together by a plurality of threaded fasteners.

12. The heat exchanger of claim 5, wherein the bottom plate is thicker than the top plate and the middle plate, and wherein the bottom plate includes a top face, an opposite bottom face, two side faces parallel to a longitudinal axis, and two end faces transverse to the longitudinal axis; and wherein the inlet port and the outlet port are each provided on one of the side faces or one of the end faces.

13. The heat exchanger of claim 12, wherein the inlet and outlet ports are located on the same or different end faces, and the bottom plate further comprises an inlet passage which extends longitudinally from the inlet port on one of the end faces toward the opposite end face, and an outlet passage which extends longitudinally from the outlet port on one of the end faces toward the opposite end face.

14. The heat exchanger of claim 13, wherein (a) the bottom plate includes a first longitudinal slot, a second longitudinal slot, and a third slot, each of which has an open top, wherein the first and second longitudinal slots extend along opposite sides of the bottom plate and are in flow communication with the inlet passage and the outlet passage respectively, and the third slot has a closed bottom and extends generally diagonally across the bottom plate, the third slot having a central portion located between the first and second longitudinal slots, and having first and second end portions aligned longitudinally with the respective first and second longitudinal slots;

(b) the middle plate having a plurality of openings extending through the middle plate and arranged in pairs, each of the openings in the middle plate being positioned to align with one of the apertures in the top plate, and each of the openings in the middle plate being aligned with one of the first longitudinal slot, the second longitudinal slot, and one of the end portions of the third slot of the bottom plate, wherein the middle plate covers and seals the open top of the third slot, other than the end portions which are aligned with the openings in the middle plate;

wherein:

the apertures in the top plate comprise a plurality of inlet apertures and a plurality of outlet apertures, wherein the inlet apertures and the outlet apertures are arranged in two rows which are transversely spaced apart from one another;

the openings in the middle plate comprise a plurality of inlet openings and a plurality of outlet openings, with each of the inlet apertures in the top plate being concentrically aligned with one of the inlet openings in the middle plate, and with each of the outlet apertures in the top plate being concentrically aligned with one of the outlet openings in the middle plate;

one of the inlet openings in the middle plate is aligned with the second end portion of the third slot in the bottom plate, and the remaining inlet openings in the middle plate being aligned with the first longitudinal slot; and one of the outlet openings in the middle plate is aligned with the first end portion of the third slot in the bottom plate, and the remaining outlet openings in the middle plate being aligned with the second longitudinal slot.

15. A heat exchanger assembly, comprising:

(a) a plurality of heat-generating components, each having a first surface and a second surface, wherein the first and second surfaces are substantially flat and planar, and wherein the heat-generating components are arranged in spaced, parallel relation to one another, with spaces being provided between adjacent pairs of said heat-generating components; and (b) a heat exchanger for cooling said plurality of heat-generating components;

the heat exchanger comprising at least three flat, fluid-carrying panels, including a first end panel, a second end panel, and at least one middle panel, wherein each said fluid-carrying panel has a first surface, an opposed second surface, and an inlet opening, an outlet opening, and a fluid-flow passageway in flow communication with the inlet and outlet openings;

wherein each of the at least one middle panels is at least partially received in one of said spaces with its first surface in thermal contact with the first or second surface of one said heat-generating component, and with its second surface in thermal contact with the first or second surface of another said heat-generating component;

wherein each of the first end panel and the second end panel has its first or second surface in thermal contact with the first or second surface of an endmost one of said heat-generating components;

wherein each of the heat-generating components has greater cooling requirements along its first surface than along its second surface;

wherein the first surface of each of the middle panels is in thermal contact with the first surface of one of the electronic components; and wherein the second surface of the each of the middle panels is in thermal contact with the second surface of one of the electronic components.

16. The heat exchanger assembly of claim 15, wherein a compressive force is applied to the assembly, such that the fluid-carrying panels are brought into intimate thermal contact with the heat-generating components along their respective first and second surfaces, wherein a direction of said compressive force is normal to the first and second surfaces of the fluid-carrying panels.

17. The heat exchanger assembly of claim 15, wherein a layer of a thermal interface material is provided between contacting pairs of said surfaces of the respective fluid-carrying panels and the electronic components which are in thermal contact with one another.

18. The heat exchanger assembly of claim 15, wherein the heat exchanger comprises a plurality of said middle panels and said assembly includes at least three of said heat-generating components, and wherein the heat-generating components comprise electronic components which are electrically connected to one another.

* * * * *